United States Patent
Ueda et al.

(10) Patent No.: US 11,502,203 B2
(45) Date of Patent: Nov. 15, 2022

(54) COATING LIQUID FOR FORMING METAL OXIDE FILM, OXIDE FILM, FIELD-EFFECT TRANSISTOR, AND METHOD FOR PRODUCING THE SAME

(71) Applicant: Ricoh Company, Ltd., Tokyo (JP)

(72) Inventors: Naoyuki Ueda, Kanagawa (JP); Yuki Nakamura, Tokyo (JP); Yukiko Abe, Kanagawa (JP); Shinji Matsumoto, Kanagawa (JP); Yuji Sone, Kanagawa (JP); Ryoichi Saotome, Kanagawa (JP); Sadanori Arae, Kanagawa (JP); Minehide Kusayanagi, Kanagawa (JP); Yuichi Ando, Hyogo (JP)

(73) Assignee: RICOH COMPANY, LTD., Tokyo (JP)

( * ) Notice: Subject to any disclaimer, the term of this patent is extended or adjusted under 35 U.S.C. 154(b) by 162 days.

(21) Appl. No.: 16/495,361

(22) PCT Filed: Mar. 22, 2018

(86) PCT No.: PCT/JP2018/011557
§ 371 (c)(1),
(2) Date: Sep. 18, 2019

(87) PCT Pub. No.: WO2018/174218
PCT Pub. Date: Sep. 27, 2018

(65) Prior Publication Data
US 2020/0075768 A1    Mar. 5, 2020

(30) Foreign Application Priority Data
Mar. 21, 2017 (JP) .............................. JP2017-054766
Mar. 19, 2018 (JP) .............................. JP2018-051783

(51) Int. Cl.
*H01L 29/786* (2006.01)
*C23C 22/06* (2006.01)
(Continued)

(52) U.S. Cl.
CPC ...... *H01L 29/7869* (2013.01); *C23C 18/1216* (2013.01); *C23C 18/143* (2019.05);
(Continued)

(58) Field of Classification Search
None
See application file for complete search history.

(56) References Cited

U.S. PATENT DOCUMENTS

2009/0127550 A1   5/2009  Imai
2009/0206341 A1   8/2009  Marks et al.
(Continued)

FOREIGN PATENT DOCUMENTS

JP   2002-076356   3/2002
JP   2005-154654   6/2005
(Continued)

OTHER PUBLICATIONS

Singaporean Office Action dated Jun. 2, 2020 in Singaporean Patent Application No. 11201908696T, 6 pages.
(Continued)

*Primary Examiner* — Colin W. Slifka
(74) *Attorney, Agent, or Firm* — Xsensus LLP

(57) ABSTRACT

A coating liquid for forming a metal oxide film, the coating liquid including: a metal source, which is at least one selected from the group consisting of inorganic salts, oxides, hydroxides, metal complexes, and organic acid salts; at least one alkali selected from the group consisting of organic alkalis and inorganic alkalis; and a solvent.

20 Claims, 7 Drawing Sheets

(51) Int. Cl.
  *C23C 22/82* (2006.01)
  *H01L 21/02* (2006.01)
  *H01L 29/66* (2006.01)
  *H01L 29/861* (2006.01)
  *C23C 18/12* (2006.01)
  *C23C 18/14* (2006.01)
(52) U.S. Cl.
  CPC ............. *C23C 22/06* (2013.01); *C23C 22/82* (2013.01); *H01L 21/02172* (2013.01); *H01L 21/02282* (2013.01); *H01L 21/02565* (2013.01); *H01L 21/02628* (2013.01); *H01L 29/66969* (2013.01); *H01L 29/861* (2013.01)

(56) References Cited

U.S. PATENT DOCUMENTS

| | | |
|---|---|---|
| 2010/0258793 A1 | 10/2010 | Seon et al. |
| 2011/0006299 A1 | 1/2011 | Abe et al. |
| 2011/0128275 A1 | 6/2011 | Ueda et al. |
| 2012/0119202 A1 | 5/2012 | Keszler et al. |
| 2012/0306834 A1 | 12/2012 | Ueda et al. |
| 2013/0036943 A1 | 2/2013 | Seon et al. |
| 2015/0044361 A1 | 2/2015 | Subramanian et al. |
| 2016/0042947 A1 | 2/2016 | Nakamura et al. |
| 2019/0027508 A1 | 1/2019 | Ueda et al. |

FOREIGN PATENT DOCUMENTS

| | | |
|---|---|---|
| JP | 2006-165529 | 6/2006 |
| JP | 2009-031761 | 2/2009 |
| JP | 2009-141341 | 6/2009 |
| JP | 2010-015092 | 1/2010 |
| JP | 2010-074148 | 4/2010 |
| JP | 2010-258058 | 11/2010 |
| JP | 2011-035376 | 2/2011 |
| JP | 2011-122177 | 6/2011 |
| JP | 2011-192971 | 9/2011 |
| JP | 2015-057363 A | 3/2015 |
| KR | 10-2015-0017683 A | 2/2015 |
| TW | 200919718 A | 5/2009 |
| TW | 201439227 A | 10/2014 |
| WO | WO2016/030452 A1 | 3/2016 |
| WO | WO2017/159810 A1 | 9/2017 |
| WO | WO2018/101278 A1 | 6/2018 |

OTHER PUBLICATIONS

Korean Office Action dated Sep. 26, 2020 in Korean Patent Application No. 10-2019-7030657 (with English translation), 21 pages.
International Search Report dated Jun. 19, 2018 for counterpart International Patent Application No. PCT/JP2018/011557 filed Mar. 22, 2018.
Written Opinion dated Jun. 19, 2018 for counterpart International Patent Application No. PCT/JP2018/011557 filed Mar. 22, 2018.
Extended European Search Report dated Dec. 4, 2020 in corresponding European Patent Application No. 18770217.0, 7 pages.
Indian Office Action dated Jan. 1, 2021 in Indian Patent Application No. 201917039577 (with English translation), 6 pages.
Japanese Office Action dated Apr. 26, 2022 issued in corresponding JP Application 2018-051783, 12 pages.

[Fig. 1]
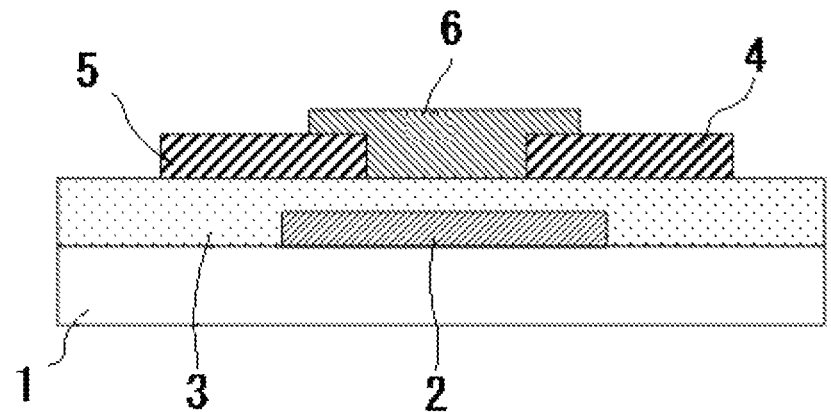
[Fig. 2]
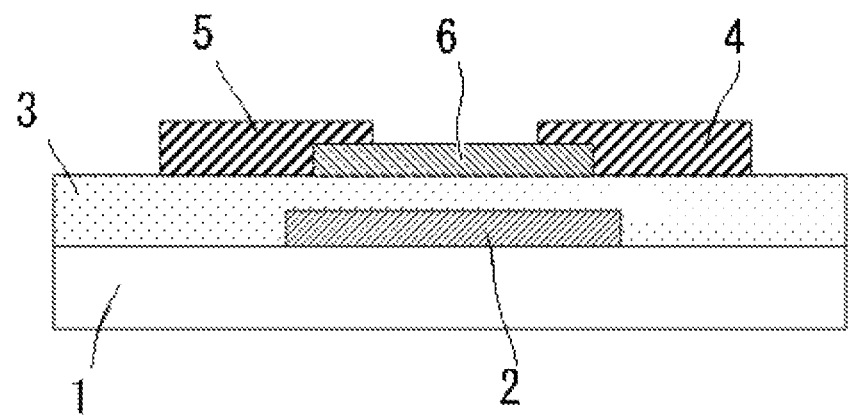
[Fig. 3]
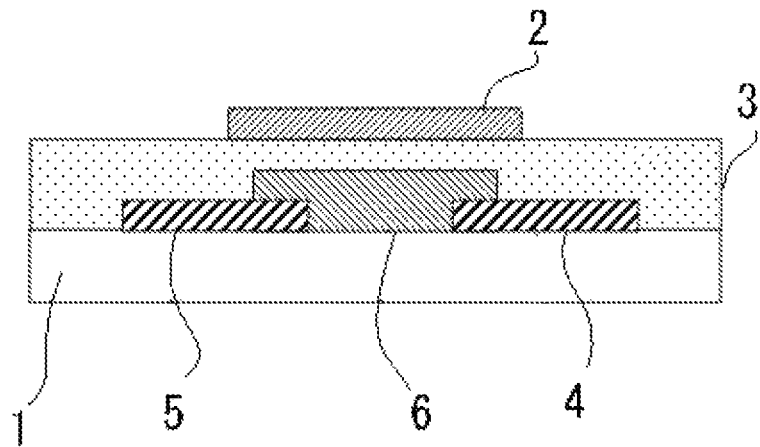

[Fig. 4]
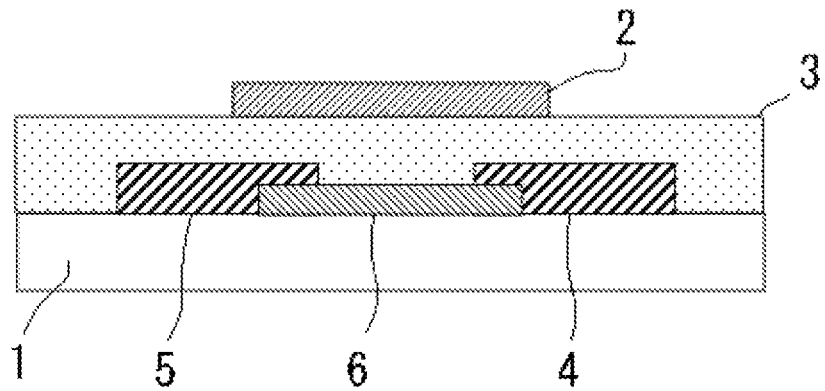
[Fig. 5A]
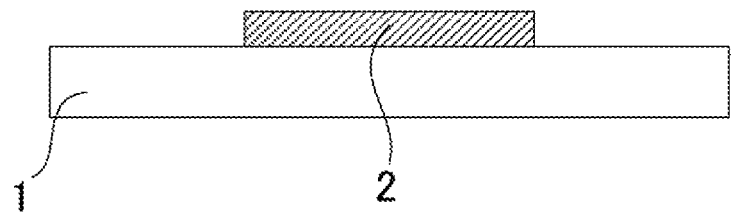
[Fig. 5B]
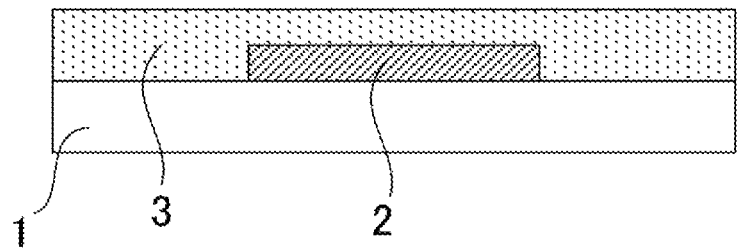
[Fig. 5C]
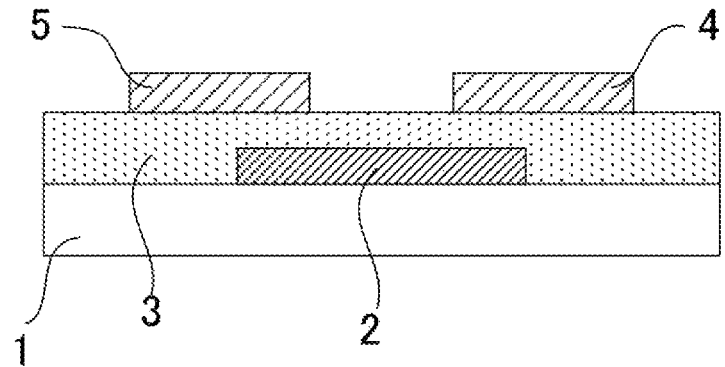

[Fig. 5D]
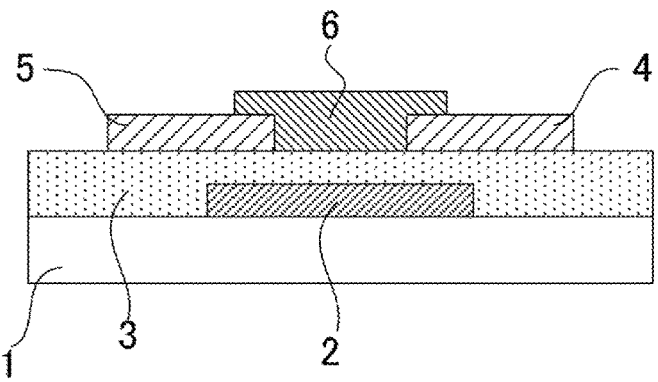
[Fig. 6]
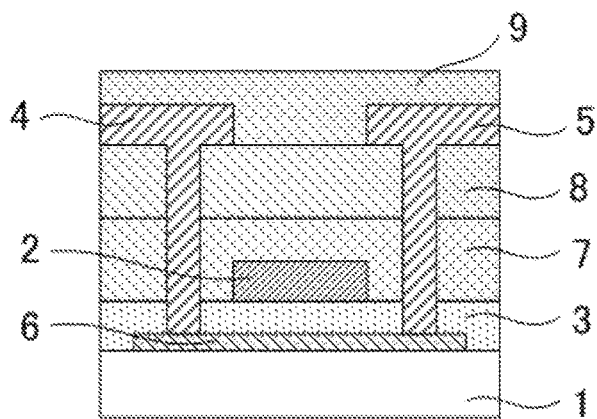
[Fig. 7]
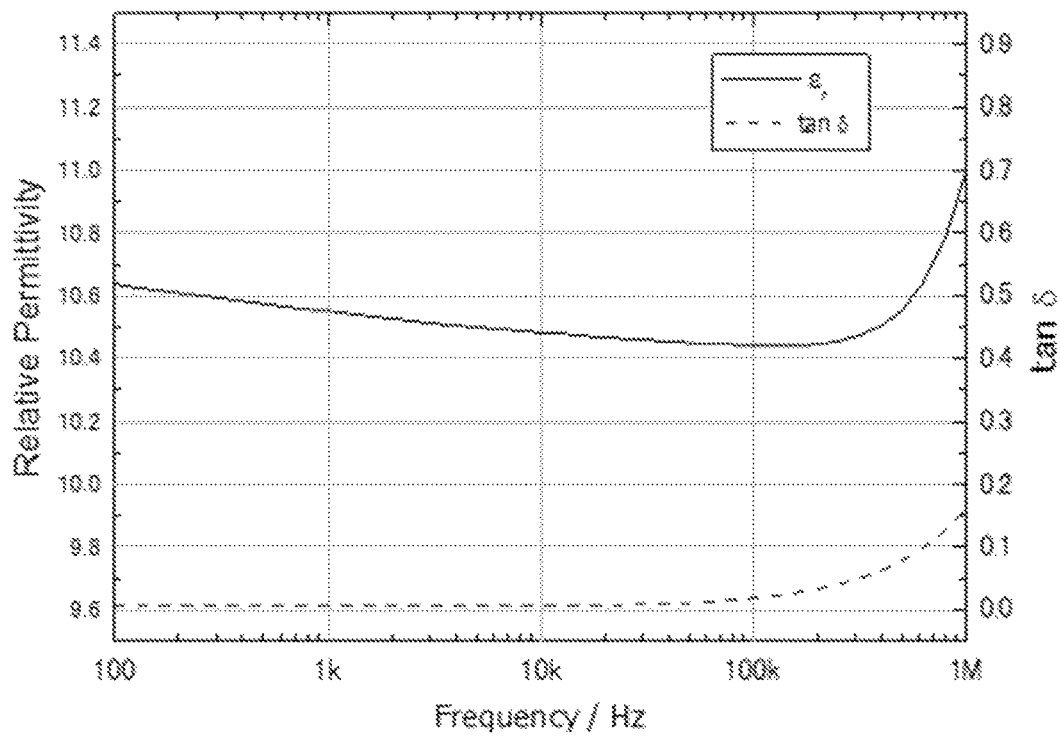

[Fig. 8]
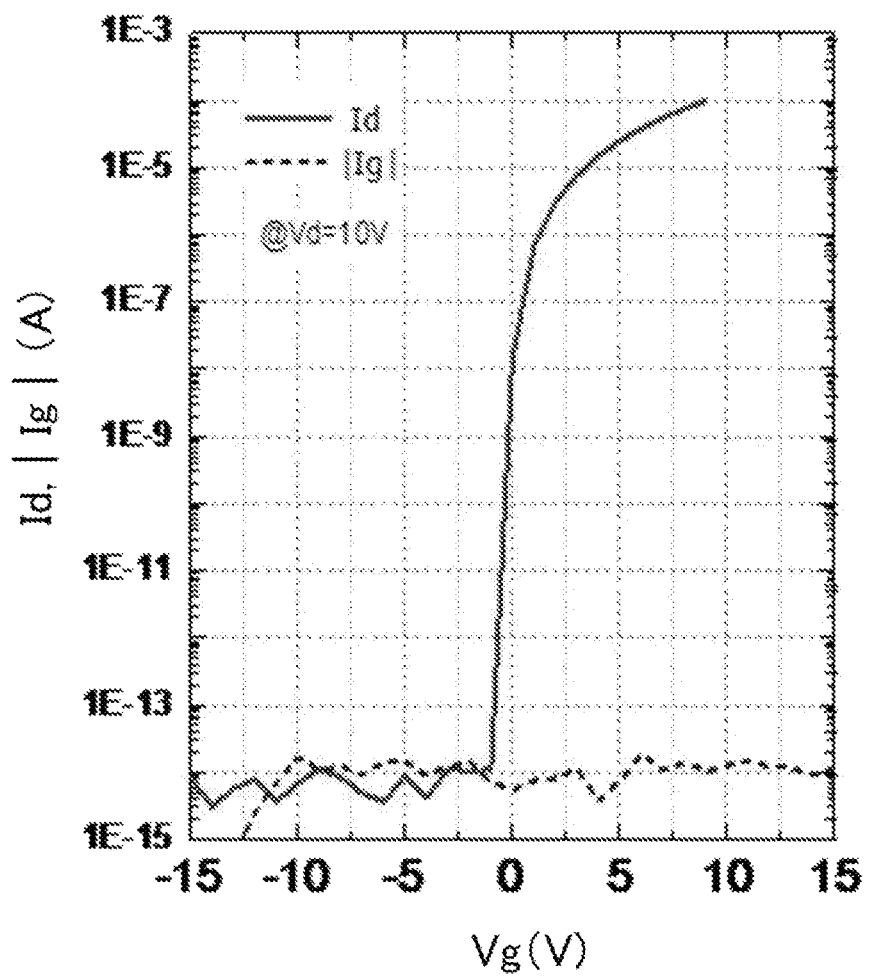

[Fig. 9]
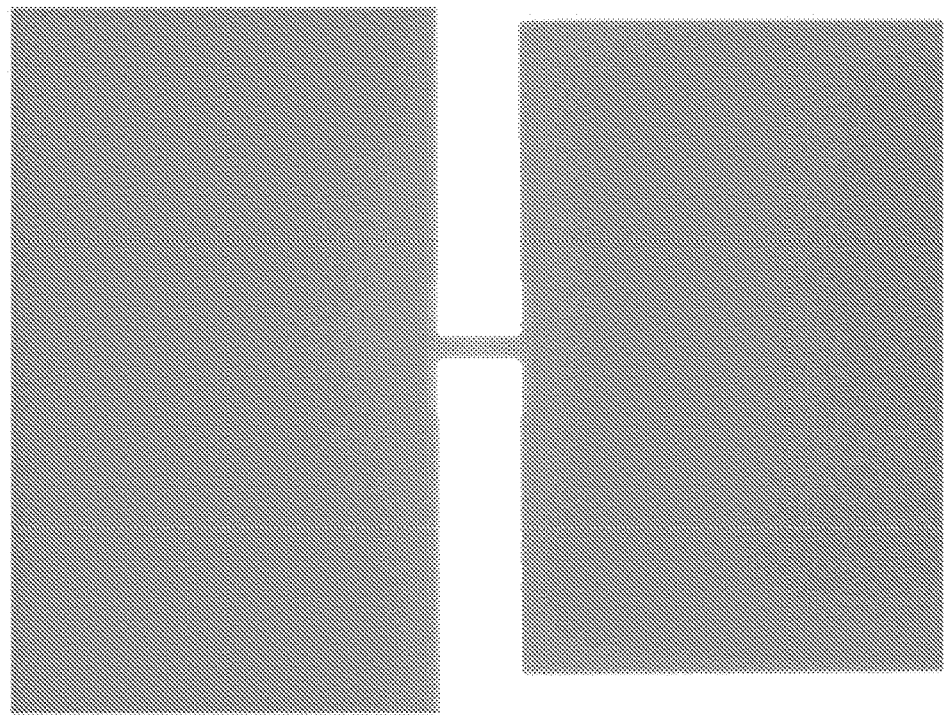
50 μm
[Fig. 10]
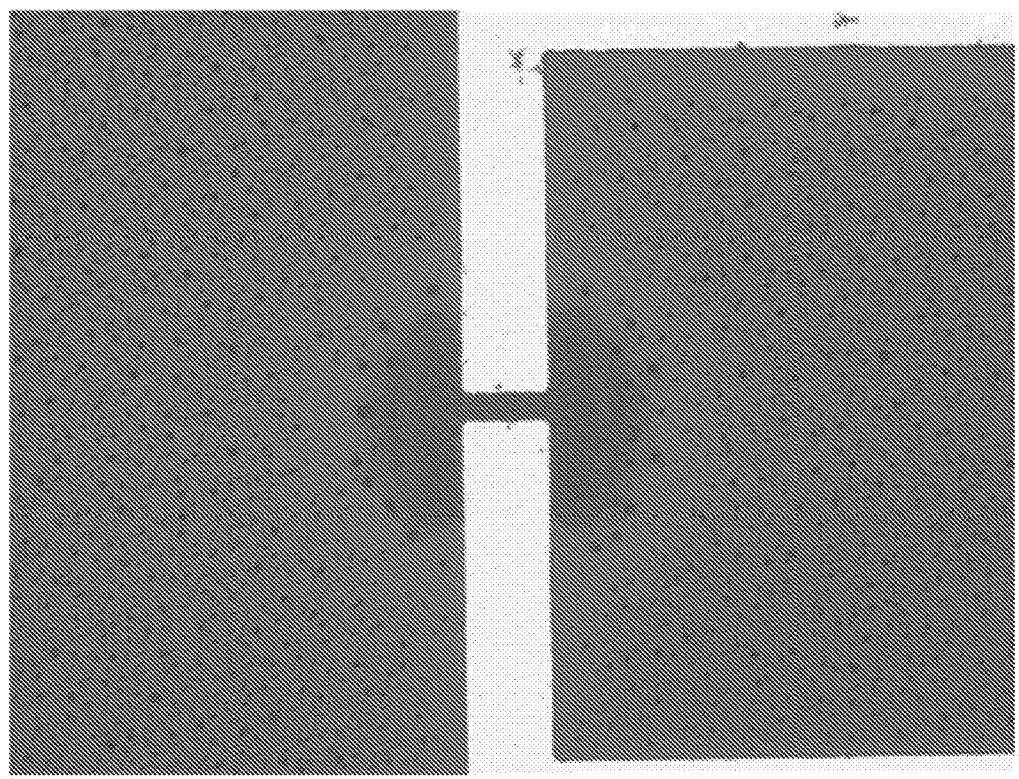
50 μm

[Fig. 11]
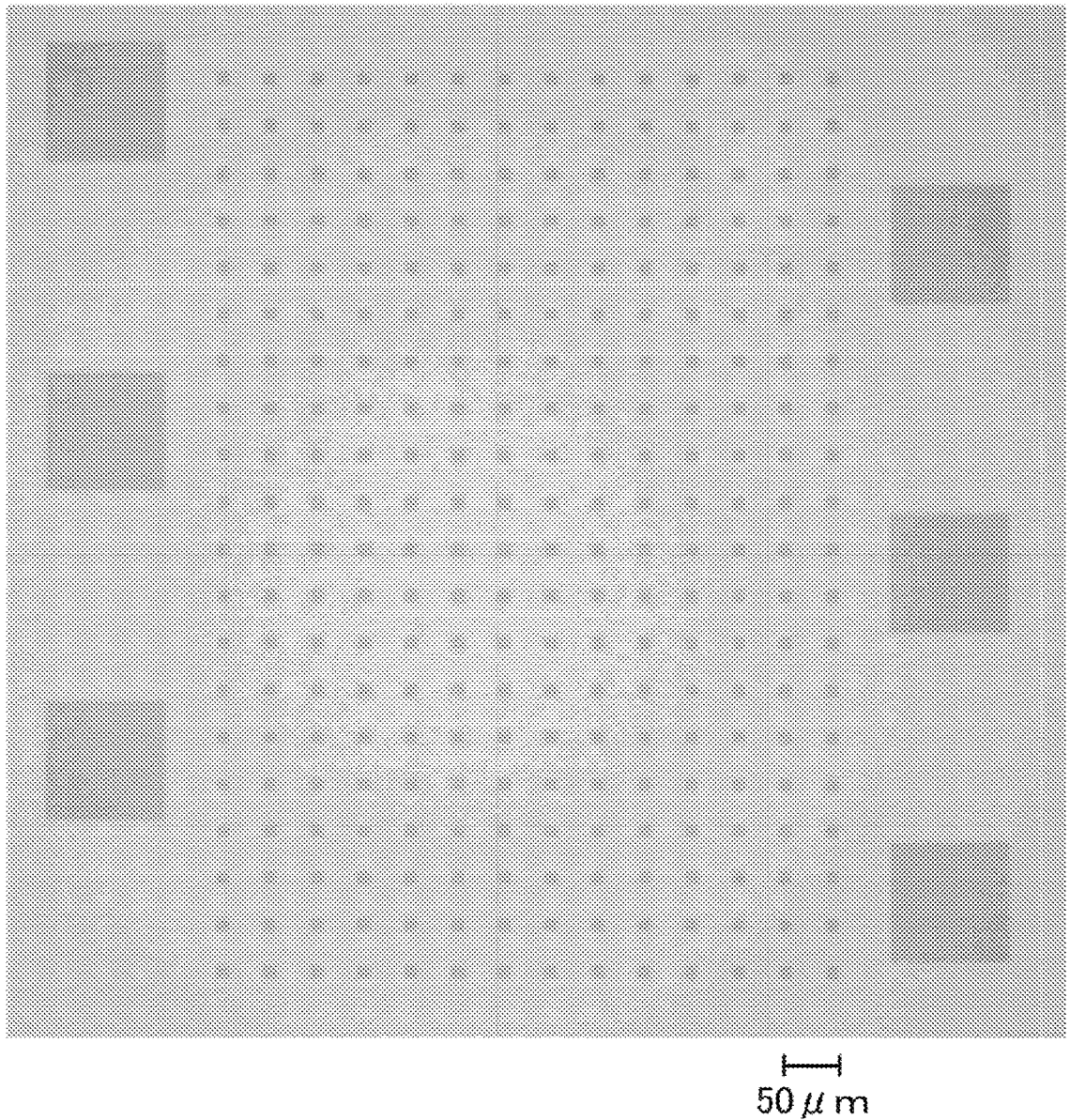
50 μm

[Fig. 12]
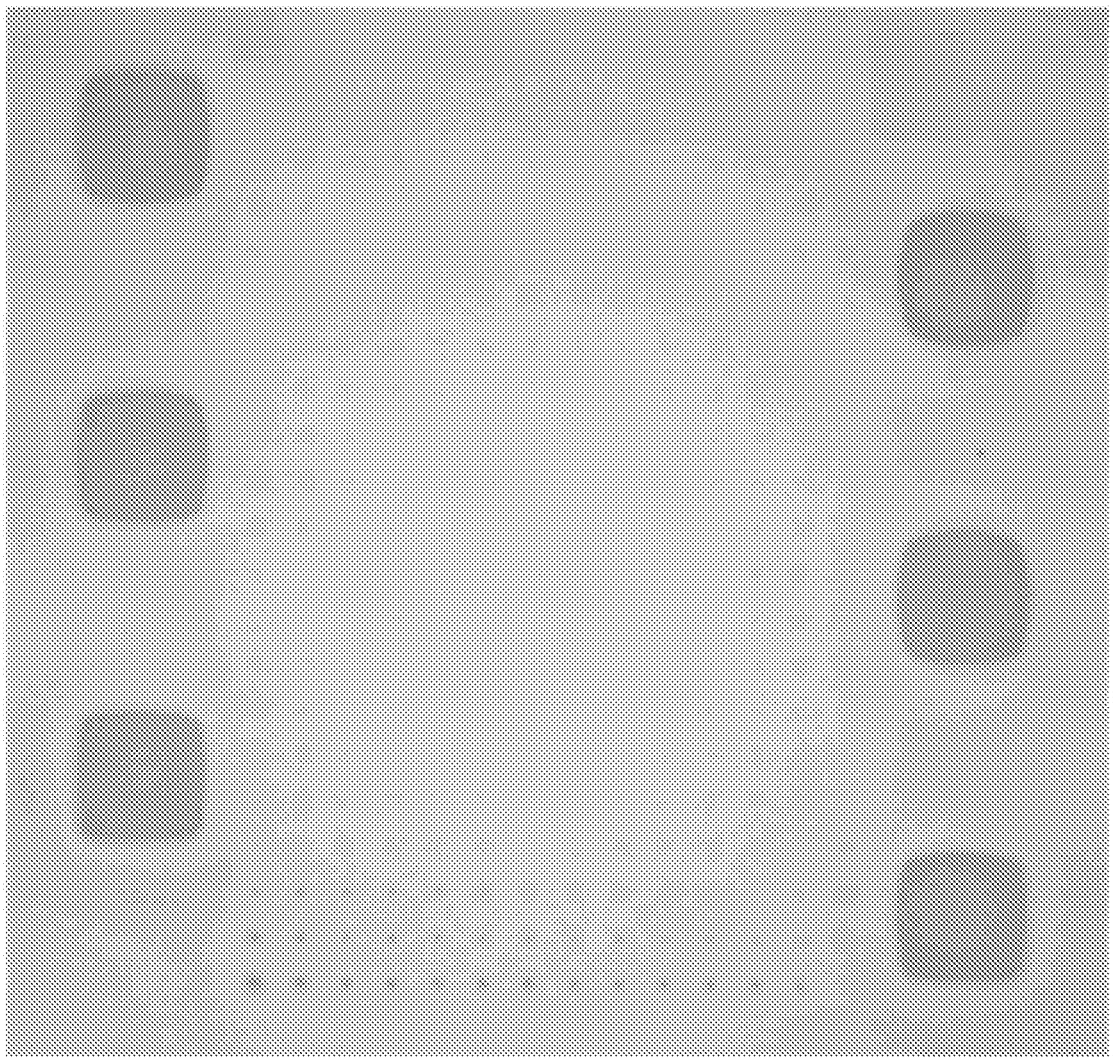

COATING LIQUID FOR FORMING METAL OXIDE FILM, OXIDE FILM, FIELD-EFFECT TRANSISTOR, AND METHOD FOR PRODUCING THE SAME

TECHNICAL FIELD

The present disclosure relates to a coating liquid for forming a metal oxide film, an oxide film, a field-effect transistor, and a method for producing the oxide film and the field-effect transistor.

BACKGROUND ART

In recent years, among flat panel displays, a liquid crystal display (LCD) or an organic EL display having an active matrix thin film transistor (AM-TFT) as a backplane has been the mainstream. The semiconductors used for the TFTs are roughly divided into the following three types: amorphous silicon (a-Si), low-temperature poly-silicon (LTPS), and In—Ga—Zn—O (IGZO)-based oxide semiconductors. Among them, oxide semiconductor TFTs (hereinafter, referred to as oxide TFTs) have been highly expected and have been researched and developed around the world (see, for example, NPL 1).

A semiconductor layer and a gate insulating layer, which are essential constituent elements of the oxide TFT, are oxide films. A typical method for forming these oxide films are, for example, the sputtering method, the chemical vapor deposition (CVD), and the atomic layer deposition (ALD).

However, there are problems that these vacuum processes require complex and expensive apparatuses and safety measures with respect to source gases, and process cost is high. In addition, limitation on the source gasses makes it difficult to freely control formulation and properties of the oxide film.

Therefore, there has been attention to the liquid-phase method, which is easy to use and makes it possible to lower cost. The liquid-phase method makes it possible to easily prepare a large area of a metal oxide film at a low process temperature. However, there are problems that coating liquids used in these processes generally easily dissolve an underlayer and a stacked structure having fine patterns cannot be formed.

Therefore, there is a need for providing a coating liquid for forming a metal oxide film that can easily prepare a large area of the metal oxide film at a low process temperature and can prevent damage to an underlayer to form a stacked structure.

CITATION LIST

Non Patent Literature

NPL 1: Thin-Film Transistors, Cherie R. Kagan (editing), Paul Andry (editing) publisher: CRC Press (2003/2/25)

SUMMARY OF INVENTION

Technical Problem

The present disclosure has an object to provide a coating liquid for forming a metal oxide film that can easily prepare a large area of the metal oxide film at a low process temperature and can prevent damage to an underlayer to form a stacked structure.

Solution to Problem

Means for solving the aforementioned problems are as follows. That is, a coating liquid of the present disclosure for forming a metal oxide film includes:

a metal source, which is at least one selected from the group consisting of inorganic salts, oxides, hydroxides, metal complexes, and organic acid salts;

at least one alkali selected from the group consisting of organic alkalis and inorganic alkalis; and a solvent.

Advantageous Effects of Invention

According to the present disclosure, it is possible to provide a coating liquid for forming a metal oxide film that can easily prepare a large area of the metal oxide film at a low process temperature and can prevent damage to an underlayer to form a stacked structure.

BRIEF DESCRIPTION OF DRAWINGS

FIG. 1 is a schematic structural view illustrating one example of a bottom gate/bottom contact field-effect transistor.

FIG. 2 is a schematic structural view illustrating one example of a bottom gate/top contact field-effect transistor.

FIG. 3 is a schematic structural view illustrating one example of a top gate/bottom contact field-effect transistor.

FIG. 4 is a schematic structural view illustrating one example of a top gate/top contact field-effect transistor.

FIG. 5A is a view illustrating one example of a method for producing a field-effect transistor of the present disclosure (part 1).

FIG. 5B is a view illustrating one example of a method for producing a field-effect transistor of the present disclosure (part 2).

FIG. 5C is a view illustrating one example of a method for producing a field-effect transistor of the present disclosure (part 3).

FIG. 5D is a view illustrating one example of a method for producing a field-effect transistor of the present disclosure (part 4).

FIG. 6 is a schematic structural view illustrating one example of a top gate/ILD field-effect transistor.

FIG. 7 is a graph presenting frequency dependences of relative dielectric constant and dielectric loss of the oxide insulator film produced in Example 3-1.

FIG. 8 is a graph presenting the gate voltage Vgs dependences of the source-drain current Ids and the absolute value of the gate voltage |Igs| of the field-effect transistor produced in Example 4-1.

FIG. 9 is a micrograph presenting a shape of the active layer after formation of the gate insulating layer of the field-effect transistor produced in Example 4-1.

FIG. 10 is a micrograph presenting a shape of the active layer after formation of the gate insulating layer of the field-effect transistor produced in Comparative Example C4-1.

FIG. 11 is a micrograph presenting a shape of the stacked film after formation of the semiconductor layer of the oxide stacked film produced in Example 5-1.

FIG. 12 is a micrograph presenting a shape of the stacked film after formation of the semiconductor layer of the oxide stacked film produced in Comparative Example C5-1.

DESCRIPTION OF EMBODIMENTS (Coating Liquid for Forming Metal Oxide Film)

A coating liquid of the present disclosure for forming a metal oxide film includes at least a metal source, an alkali, and a solvent, and further includes other components if necessary.

A pH of the coating liquid for forming a metal oxide film is preferably 5 or more, more preferably 6 or more but 12 or less, particularly preferably 6.5 or more but 11 or less.

The pH can be measured with, for example, a pH meter or a pH test paper.

The coating liquid of the present disclosure for forming a metal oxide film is obtained by dissolving a metal source as a solute in a solvent.

The metal source is at least one selected from the group consisting of inorganic salts, oxides, hydroxides, metal complexes, and organic acid salts.

Examples of the inorganic salts include nitrates, sulfates, chlorides, carbonates, acetates, and phosphates. These may be used alone or in combination.

Examples of the organic acid salts include carboxylates, phenols, and derivatives thereof. These may be used alone or in combination.

Examples of the carboxylates include aliphatic carboxylates, aromatic carboxylates, hydroxy carboxylates, dicarboxylates, tricarboxylates, and oxocarboxylates. These may be used alone or in combination.

Examples of the solvent include organic acids, organic acid esters, aromatic compounds, diols, glycol ethers, polar aprotic solvents, alkane compounds, alkene compounds, ethers, alcohols, and water. These may be used alone or in combination.

The metal source as the solute may be dissociated to be ions so long as it is uniformly dissolved in the solvent. In this case, it is difficult to cause segregation of the concentration in the coating liquid for forming a metal oxide film, which makes it possible to use the coating liquid for forming a metal oxide film for a long period of time. In addition, a thin film produced by using this coating liquid has a homogeneous formulation. Therefore, characteristic uniformity is also favorable when it is used in, for example, the gate insulating layer and the semiconductor layer of TFTs.

When an element obtained by stacking thin films (for example, a TFT having a top gate/top contact structure presented in FIG. 4) is prepared, a semiconductor layer (active layer) and source—drain electrode layers are formed through patterning and then a gate insulating layer is formed. At this time, when a conventional coating liquid is coated and undergoes the drying—baking process, the underlayer that has been already formed may be dissolved in the coating liquid in some cases.

The present inventors have diligently performed the studies in order to solve the problem that the conventional coating liquids for forming a metal oxide film used in the liquid phase method easily dissolve the underlayer and hardly form fine patterns.

As a result, the present inventors have found that addition of the alkali to the coating liquid for forming a metal oxide film can solve the problem that the coating liquid for forming a metal oxide film dissolves the underlayer to prevent formation of fine patterns. As a result, the present inventors have completed the present disclosure.

In addition, the coating liquid of the present disclosure for forming a metal oxide film can prevent corrosion of components to contact with liquid in production apparatuses (e.g., nozzles and valves in coater apparatuses).

In one aspect of the present disclosure, the pH is adjusted to from weak acidic to neutral and then to alkaline so as not to dissolve an underlayer, by adding alkali such as an organic alkali or an inorganic alkali to the coating liquid for forming a metal oxide film.

In the case that the alkali is solid or gas when the alkali is added to the coating liquid for forming a metal oxide film, the alkali may be added in a state of the solution obtained by dissolving the alkali in a solvent (e.g., water).

<Alkali>

The alkali is, for example, an organic alkali and an inorganic alkali. Preferable examples of the organic alkali include quaternary ammonium salts, quaternary ammonium hydroxides, and aminoalcohols.

Preferable examples of the organic alkali include tetramethylammonium hydroxide (TMAH), Choline (2-hydroxyethyltrimethylammonium hydroxide), L-carnitine, benzyl trimethylammonium hydroxide, betaine, monoethanolamine (MEA), N-ethyldiethanolamine, and 2-(dimethylamino) ethanol.

Examples of the quaternary ammonium salts include tetramethylammonium hydroxide.

Examples of the quaternary ammonium hydroxides include 2-hydroxyethyltrimethylammonium hydroxide (Choline).

Examples of the aminoalcohol include monoalkanolamines, dialkanolamines, and tri-alkanolamines. Among them, dialkanolamines and trialkanolamines are preferable from the viewpoints of solubility and safety.

The monoalkanolamine includes an amino group and one hydroxyl group. Examples of the monoalkanolamine include monoethanolamine, monopropanolamine, dimethy-laminoethanol, and N-methylethanolamine.

The dialkanolamine includes an amino group and two hydroxyl groups. Examples of the dialkanolamine include diethanolamine, N-methyldiethanolamine, N-ethyldiethanolamine, and diisopropanolamine.

The trialkanolamine includes an amino group and three hydroxyl groups. Examples of the trialkanolamine include triethanolamine and triisopropanolamine.

Examples of the other organic alkalis include nitrogen heterocycles such as pyridine and DBU (1,8-diazabicyclo [5.4.0]-7-undecene).

Examples of the inorganic alkalis include an aqueous ammonium solution and an aqueous barium hydroxide solution.

An amount of the alkali in the coating liquid for forming a metal oxide film is not particularly limited and may be appropriately selected depending on the intended purpose.

In the coating liquid for forming a metal oxide film, the metal source preferably includes at least one Group A element selected from the group consisting of rare earth elements, Bi, Te, and Sb because it is possible to form an oxide insulator film having high dielectric constant.

Examples of the rare earth elements include Sc, Y, La, Ce, and Lu.

In the coating liquid for forming a metal oxide film, the metal source preferably includes at least one Group B element selected from the group consisting of Mg, Ca, Sr, and Ba because it is possible to form a wide-band gap oxide film.

In the coating liquid for forming a metal oxide film, the metal source preferably includes at least one Group C element selected from the group consisting of Ti, Zr, Hf, Al, and Ga because it is possible to form an oxide insulator film having high dielectric constant or to form a wide-band gap oxide film.

In the coating liquid for forming a metal oxide film, the metal source preferably includes at least one Group D element selected from the group consisting of Zn, Cd, Ga, In, Tl, Sn, and Pb because it is possible to form an oxide semiconductor film. In the coating liquid for forming a metal oxide film, the metal source preferably includes at least one Group E element selected from the group consisting of Ti, Zr, Hf, Sn, Nb, Ta, Mo, W, and Re in terms of the carrier doping with respect to the oxide semiconductor film.

In the coating liquid for forming a metal oxide film, an electron configuration of a metal ion included in the metal source is preferably a closed-shell because it is possible to form an oxide insulator film or a wide-band gap oxide semiconductor film.

The coating liquid for forming a metal oxide film is preferably transparent or light yellow because it is possible to form an oxide insulator film or a wide-band gap oxide semiconductor film.

Here, whether the coating liquid for forming a metal oxide film is transparent or light yellow can be judged in the following manner, for example.

First, the coating liquid for forming a metal oxide film is charged into a transparent container having a width of 1 cm. Then the container is observed from its width direction for judgement. Alternatively, the measurement may be performed with an ultraviolet and visible spectrophotometer (V-770 available from JASCO).

<Insulator Film>

When the metal oxide film formed from the coating liquid of the present disclosure for forming a metal oxide film (hereinafter may be referred to as "the present coating liquid") is, for example, the insulator film constituting the gate insulating layer, the metal oxide film is required to have a high insulation property (high resistance). Therefore, the metal oxide film desirably has a wide band gap (preferably 3 eV or more). Therefore, when the metal oxide film produced by using the present coating liquid is the insulator film, the present coating liquid and the film have no optical absorption band resulting from the electron transition in the visible light region or the near-infrared region. Therefore, it is preferable that the present coating liquid and the metal oxide film produced by using the present coating liquid preferably do not have any of the Group 5 to 11 transition metal elements. These elements easily have an open-shell electronic state and then an absorption band resulting from the d-d transition in the aforementioned wavelength regions will occur. Therefore, these elements are not suitable for an element constituting an insulator. Meanwhile, some lanthanoid elements have a narrow absorption band in the visible light region or the near-infrared region. However, the absorption is the f-f transition isolated on the atom and an insulation property can be maintained. Therefore, the present coating liquid and the metal oxide film produced by using the present coating liquid may include the lanthanoid element.

Hitherto, a method for increasing amorphous property and realizing high insulating property by incorporation of Si or Al as a main component has been employed, but is not preferable in order to realize high dielectric constant. The metal element, which is a main constituting element in the present coating liquid and the metal oxide film prepared by using the present coating liquid, is preferably at least one selected from the group consisting of the Period 4 elements, the Period 5 elements, and the Period 6 elements. Such a metal element is an element where the s-orbital, the p-orbital, and the d-orbital are a closed-shell. Therefore, it is possible to realize high dielectric constant and low dielectric loss at the same time.

A volume resistivity of the insulator film in the present disclosure is preferably $10^6$ Ωcm or more, more preferably $10^{10}$ Ωcm or more.

A gate current of the field-effect transistor including the insulator film of the present disclosure as the gate insulating film is preferably 1 nA or less, more preferably 1 pA or less, still more preferably 100 fA or less.

Use of the coating liquid for forming a metal oxide film makes it possible to obtain a metal oxide insulator film having a desired relative dielectric constant and dielectric loss.

Note that, it is possible to control relative dielectric constant and dielectric loss of the metal oxide insulator film obtained depending on the conditions (specifically, a kind of the solvent in which the solute is dissolved, formulation of the coating liquid, and a concentration of the coating liquid). Moreover, it is possible to control relative di-electric constant and dielectric loss depending on the conditions of the heat treatment after the coating (more specifically, a baking temperature, a baking time, a heating speed, a cooling speed, and atmosphere (gas percentage and pressure) during the baking.

Moreover, the effects of the irradiation of light can be used; those are, for example, the decomposition of the materials and the acceleration of the reaction. Furthermore, relative dielectric constant and dielectric loss are also changed by annealing after formation of the film. Therefore, a method for optimizing the annealing temperature and the atmosphere is also effective.

<Semiconductor Film>

When the metal oxide film formed from the coating liquid of the present disclosure for forming a metal oxide film is, for example, the semiconductor film constituting the active layer, the semiconductor film is required to have a high mobility. In order to realize a further lower off-current, the semiconductor film is desirably required to have a wide band gap (preferably 3 eV or more). Therefore, when the metal oxide film produced by using the present coating liquid is the semiconductor film, the present coating liquid and the film have no optical absorption band resulting from the electron transition in the visible light region. Thus, it is preferable that the present coating liquid and the metal oxide semiconductor film produced by using the present coating liquid do not have any of the Group 5 to 11 transition metal elements as a main solute. These elements easily have an open-shell electronic state and then an absorption band resulting from the d-d transition in the aforementioned wavelength region will occur. In addition, when the bottom of the conduction band or the top of the valence band is constituted with the d orbit, the band width becomes narrow, which cannot realize a high mobility. Therefore, these transition metal elements are not suitable for an element constituting the semiconductor. In order to realize high mobility of the wide gap n-type semiconductor, the bottom of the conduction band is preferably constituted with the 4 s and/or 5 s orbits. To do so, the bottom of the conduction band is preferably constituted with a p block heavy element such as Zn, Cd, Ga, In, or Sn. Moreover, in order to decrease oxygen vacancies, the semiconductor preferably includes, for example, the Group 3 element or the light element (Al and Ga) of the Group 13 element.

It is difficult to achieve a uniform formulation of the target used by, for example, the sputtering method and the laser abrasion method. In particular, it may be difficult to prepare the target itself depending on the formulation. Moreover, sputtering efficiency of each element is different, and thus it is difficult to uniformly maintain the formulation within duration of the target life. Furthermore, use of the vacuum process makes it difficult to reduce an amount of oxygen vacancies in the films. This leads to instability in the properties of the semiconductor films.

Use of the coating liquid for forming a metal oxide film solves the problems in the vacuum process and makes it possible to produce a metal oxide film having a uniform and stable composition. Consequently, TFTs having high performance become to be able to be stably manufactured.

Hereinafter, the coating liquid for forming a metal oxide film will be described in detail.

The coating liquid for forming a metal oxide film is obtained by, for example, dissolving the metal source in the solvent.

Examples of the metal source include inorganic salts, oxides, hydroxides, metal complexes, and organic acid salts.

Hereinafter, the metal source will be independently described in terms of the kind of metals.

<<Scandium-Including Compound>>

The scandium-including compound may be appropriately selected depending on the intended purpose. Examples of the scandium-including compound include scandium nitrate pentahydrate, scandium chloride hexahydrate, scandium acetate hydrate, scandium oxide, scandium hydroxide, scandium acetylacetonate, and scandium 2-ethylhexanoate.

These scandium-including compounds may be a synthesized product or a commercially available product.

<<Yttrium-Including Compound>>

The yttrium-including compound may be appropriately selected depending on the intended purpose. Examples of the yttrium-including compound include yttrium nitrate hexahydrate, yttrium chloride hexahydrate, yttrium acetate tetrahydrate, yttrium oxide, yttrium hydroxide, yttrium acetylacetonate, and yttrium 2-ethylhexanoate.

These yttrium-including compounds may be a synthesized product or a commercially available product.

<<Lanthanoid-Including Compound>>

A lanthanum-including compound, a cerium-including compound, and a lutetium-including compound as typical examples of the lanthanoid-including compound will be described below.

<<<Lanthanum-Including Compound>>>

Lanthanum (La) is one example of lanthanoid (Ln).

The lanthanum-including compound is not particularly limited and may be appropriately selected depending on the intended purpose. Examples of the lanthanum-including compound include lanthanum nitrate hexahydrate, lanthanum chloride heptahydrate, lanthanum phosphate hydrate, lanthanum acetate hydrate, lanthanum oxide, lanthanum hydroxide, lanthanum acetylacetonate, and lanthanum 2-ethylhexanoate.

These lanthanum-including compounds may be a synthesized product or a commercially available product.

<<<Cerium-Including Compound>>>

Cerium (Ce) is one example of lanthanoid (Ln).

The cerium-including compound is not particularly limited and may be appropriately selected depending on the intended purpose. Examples of the cerium-including compound include cerium nitrate hexahydrate, cerium chloride heptahydrate, cerium acetate monohydrate, cerium oxide, cerium hydroxide, cerium acetylacetonate, and cerium 2-ethylhexanoate.

These cerium-including compounds may be a synthesized product or a commercially available product.

<<<Lutetium-Including Compound>>>

Lutetium (Lu) is one example of lanthanoid (Ln).

The lutetium-including compound is not particularly limited and may be appropriately selected depending on the intended purpose. Examples of the lutetium-including compound include lutetium nitrate hexahydrate, lutetium chloride hexahydrate, lutetium acetate tetrahydrate, lutetium oxide, lutetium hydroxide, lutetium acetylacetonate, and lutetium 2-ethylhexanoate.

These lutetium-including compounds may be a synthesized product or a commercially available product.

<<Zirconium-Including Compound>>

The zirconium-including compound is not particularly limited and may be appropriately selected depending on the intended purpose. Examples of the zirconium-including compound include zirconium oxynitrate dihydrate, anhydrous zirconium chloride, zirconium chloride hydrate, zirconium oxysulfate, zirconium acetate tetrahydrate, zirconium oxide, zirconium hydroxide, zirconium acetylacetonate, and zirconium 2-ethylhexanoate.

These zirconium-including compounds may be a synthesized product or a commercially available product.

<<Hafnium-Including Compound>>

The hafnium-including compound is not particularly limited and may be appropriately selected depending on the intended purpose. Examples of the hafnium-including compound include hafnium nitrate anhydride, anhydrous hafnium chloride, hafnium chloride tetrahydrofuran complex, hafnium sulfate, hafnium acetate, hafnium oxide, hafnium hydroxide, hafnium acetylacetonate, and hafnium 2-ethylhexanoate.

These hafnium-including compounds may be a synthesized product or a commercially available product.

<<Zinc-Including Compound>>

The zinc-including compound is not particularly limited and may be appropriately selected depending on the intended purpose. Examples of the zinc-including compound include zinc nitrate hexahydrate, zinc chloride, zinc acetate dihydrate, zinc oxide, zinc hydroxide, zinc acetylacetonate, and zinc 2-ethylhexanoate.

These zinc-including compounds may be a synthesized product or a commercially available product.

<<Gallium-Including Compound>>

The gallium-including compound is not particularly limited and may be appropriately selected depending on the intended purpose. Examples of the gallium-including compound include gallium nitrate hydrate, gallium chloride, gallium acetate, gallium oxide, gallium hydroxide, gallium acetylacetonate, and gallium 2-ethylhexanoate.

These gallium-including compounds may be a synthesized product or a commercially available product.

<<Indium-Including Compound>>

The indium-including compound is not particularly limited and may be appropriately selected depending on the intended purpose. Examples of the indium-including compound include indium nitrate trihydrate, indium chloride tetrahydrate, indium acetate, indium oxide, indium hydroxide, indium acetylacetonate, and indium 2-ethylhexanoate.

These indium-including compounds may be a synthesized product or a commercially available product.

<<Tin-Including Compound>>

The tin-including compound is not particularly limited and may be appropriately selected depending on the intended purpose. Examples of the tin-including compound include tin nitrate trihydrate, tin chloride, tin acetate, tin oxide, tin hydroxide, tin acety-lacetonate, and tin 2-ethylhexanoate.

These tin-including compounds may be a synthesized product or a commercially available product.

<<Bismuth-Including Compound>>

The bismuth-including compound is not particularly limited and may be appropriately selected depending on the intended purpose. Examples of the bismuth-including compound include bismuth nitrate pentahydrate, bismuth chloride, bismuth acetate, bismuth oxide, bismuth hydroxide, bismuth acetylacetonate, and bismuth 2-ethylhexanoate.

These bismuth-including compounds may be a synthesized product or a commercially available product.

<<Calcium-Including Compound>>

The calcium-including compound is not particularly limited and may be appropriately selected depending on the intended purpose. Examples of the calcium-including compound include calcium nitrate tetrahydrate, calcium chloride dihydrate, calcium acetate monohydrate, calcium oxide, calcium hydroxide, calcium acetylacetonate, calcium propionate hydrate, calcium 2-ethylhexanoate, calcium neodecanoate, calcium benzoate, calcium lactate pentahydrate, calcium 3-hydroxy-3-methylbutyrate, calcium salicylate dihydrate, calcium tartrate tetrahydrate, and calcium phenoxide.

These calcium-including compounds may be a synthesized product or a commercially available product.

As described above, the compounds including scandium (Sc), yttrium (Y), lanthanoid [lanthanum (La), cerium (Ce), and lutetium (Lu)], zirconium (Zr), hafnium (Hf), zinc (Zn), gallium (Ga), indium (In), tin (Sn), bismuth (Bi), and calcium (Ca) have been described in detail. Similar descriptions to the above are applicable to, for example, titanium (Ti), antimony (Sb), tellurium (Te), magnesium (Mg), strontium (Sr), barium (Ba), niobium (Nb), tungsten (W), and rhenium (Re).

<<Solvent>>

The solvent is not particularly limited and may be appropriately selected depending on the intended purpose. Preferable examples thereof include organic solvents and aqueous solutions.

<<<Organic Solvent>>>

The organic solvent is not particularly limited and may be appropriately selected depending on the intended purpose. The organic solvent is preferably at least one selected from the group consisting of organic acids, organic acid esters, aromatic compounds, diols, glycol ethers, polar aprotic solvents, alkane compounds, alkene compounds, ether compounds, and alcohols.

—Organic Acid—

The organic acid is not particularly limited and may be appropriately selected depending on the intended purpose. Preferable examples of the organic acid include acetic acid, lactic acid, propionic acid, octylic acid, neodecanoic acid, and derivatives thereof.

These may be used alone or in combination.

—Organic Acid Ester—

The organic acid ester is not particularly limited and may be appropriately selected depending on the intended purpose. Preferable examples of the organic acid ester include ethyl acetate, propyl acetate, methyl lactate, propyl propionate, and derivatives thereof.

These may be used alone or in combination.

—Aromatic Compound—

The aromatic compound is not particularly limited and may be appropriately selected depending on the intended purpose. Preferable examples of the aromatic compound include toluene, xylene, mesitylene, tetralin, and derivatives thereof.

These may be used alone or in combination.

—Diol—

The diol is not particularly limited and may be appropriately selected depending on the intended purpose, and is preferably alkanediol and dialkylene glycol. The diol preferably includes 2 through 6 carbon atoms. The diol is more preferably at least one of diethylene glycol, 1,2-ethanediol, 1,2-propanediol, and 1,3-butanediol. These may be used alone or in combination.

—Glycol Ether—

The glycol ether is not particularly limited and may be appropriately selected depending on the intended purpose, and is preferably alkylene glycol monoalkyl ether. The glycol ether preferably includes from 3 through 8 carbon atoms.

The alkylene glycol monoalkyl ether is preferably at least one selected from the group consisting of ethylene glycol monomethyl ether, ethylene glycol monoethyl ether, ethylene glycol monopropyl ether, ethylene glycol monobutyl ether, propylene glycol-1-monomethyl ether, and propylene glycol-1-monobutyl ether. These alkylene glycol monoalkyl ethers have a boiling point of from about 120 degrees Celsius through about 180 degrees Celsius, which makes it possible to bake the coating liquid at relatively low temperature for a short time. Also, the oxide film with low impurities such as carbon and organic matter after the baking can be obtained.

These may be used alone or in combination.

—Polar Aprotic Solvent—

The polar aprotic solvent favorably dissolves the metal source and exhibits high stability after the dissolution. Therefore, when the polar aprotic solvent is used for the coating liquid for forming a metal oxide film, a metal oxide film having high homogeneity and less deficiency can be obtained.

The polar aprotic solvent is not particularly limited and may be appropriately selected depending on the intended purpose. Preferable examples of the polar aprotic solvent include isophorone, propylene carbonate, tetrahydrofuran, dihydrofuran-2(3H)-one, dimethylformamide, dimethylacetamide, 1,3-dimethyl-2-imidazolidinone, and derivatives thereof.

These may be used alone or in combination.

—Alkane Compound—

The alkane compound is not particularly limited and may be appropriately selected depending on the intended purpose. For example, n-hexane, cyclohexane, n-nonane, tetradecane, decaline, and derivatives thereof are preferable.

These may be used alone or in combination.

—Alkene Compound—

The alkene compound is not particularly limited and may be appropriately selected depending on the intended purpose. For example, 1-dodecene, 1-tetradecene, and derivatives thereof are preferable.

These may be used alone or in combination.

—Ether Compound—

The ether compound is not particularly limited and may be appropriately selected depending on the intended purpose. For example, tetrahydrofuran, polyethylene glycol, and derivatives thereof are preferable.

These may be used alone or in combination.

—Alcohol—

The alcohol is not particularly limited and may be appropriately selected depending on the intended purpose. For examples, methanol, ethanol, isopropyl alcohol, t-butanol, and derivatives thereof are preferable.

These may be used alone or in combination.

In the coating liquid for forming a metal oxide film, the metal source is preferably dissolved in the organic solvent or water.

<Method for Preparing Coating Liquid for Forming Metal Oxide Film>

A method for preparing the coating liquid for forming a metal oxide film is not particularly limited and may be appropriately selected depending on the intended purpose. One specific example of the method is as follows. Specifically, a metal salt diol solution and a metal salt glycol ether solution are prepared, respectively. Then, the metal salt diol solution and the metal salt glycol ether solution are mixed at a desired ratio and are further mixed with alkali such as aminoalcohol.

The coating liquid of the present disclosure for forming a metal oxide film is suitable for a coating liquid for preparing a metal oxide film. Particularly, the coating liquid of the present disclosure is suitable for a coating liquid for preparing an active layer, a gate insulating film, and an interlayer dielectrics of a field-effect transistor.

Note that, in the present disclosure, the metal oxide may include nitrogen. That is, the metal oxide may be a so-called oxynitride.

(Metal Oxide Film)

In one aspect, the metal oxide film of the present disclosure is obtained by coating the coating liquid of the present disclosure for forming a metal oxide film on an object to be coated, drying it and then baking it.

In one aspect, the metal oxide film of the present disclosure is a baked product of the coating liquid of the present disclosure for forming a metal oxide film.

The metal oxide film can be obtained by, for example, a method for producing the metal oxide film of the present disclosure, which will be described hereinafter.

The metal oxide film may include one kind of the metal element or two or more metal elements.

The metal oxide film is a metal oxide insulator film or a metal oxide semiconductor film.

The metal oxide film preferably has no optical absorption band resulting from the electron transition in the visible light region or the near-infrared region.

(Oxide Stacked Film)

In one aspect, the oxide stacked film of the present disclosure is obtained by coating the coating liquid of the present disclosure for forming a metal oxide film on an oxide film and drying the coating liquid, followed by baking.

In one aspect, the oxide stacked film of the present disclosure includes an oxide film and a baked product of the coating liquid of the present disclosure for forming a metal oxide film on the oxide film, and further includes other components if necessary.

The oxide film is, for example, an oxide semiconductor and an oxide insulator.

The oxide stacked film preferably has no optical absorption band resulting from the electron transition in the visible light region or the near-infrared region.

A method for producing the oxide stacked film is not particularly limited and may be appropriately selected depending on the intended purpose. The method includes coating the coating liquid of the present disclosure for forming a metal oxide film on an oxide film and drying the coating liquid, followed by baking. Details of this production method are the same production method as the below-described method for producing the metal oxide film.

(Method for Producing Metal Oxide Film)

A method for producing the metal oxide film of the present disclosure includes coating the coating liquid of the present disclosure for forming a metal oxide film on an object to be coated and drying the coating liquid, followed by baking.

When a coating liquid that includes a group of p block heavy elements is used as the coating liquid for forming a metal oxide film, an n-type oxide semiconductor film particularly suitable for the active layer of the field-effect transistor can be obtained.

The object to be coated is not particularly limited and may be appropriately selected depending on the intended purpose. Examples of the object include glass substrates and plastic substrates.

When the metal oxide film is used in the active layer of the field-effect transistor, the object used is, for example, a substrate or a gate insulating film. A shape, a structure, and a size of the substrate are not particularly limited and may be appropriately selected depending on the intended purpose. The material of the substrate is not particularly limited and may be appropriately selected depending on the intended purpose. Examples of the material include glass and plastic.

A method for the coating is not particularly limited and may be appropriately selected depending on the intended purpose. Examples of the method include the screen printing method, the roll coating method, the dip-coating method, the spin coating method, the die coating method, the inkjet method, and the nanoimprint method. Among them, the spin coating method and the die coating method are preferable because these methods are easily combined with the existing photolithography techniques.

The drying process is not particularly limited and may be appropriately selected depending on the intended purpose, so long as volatile components in the coating liquid for forming a metal oxide film can be removed. Note that, in the drying, it is unnecessary to completely remove the volatile components, and the volatile components may be removed in such a degree that the volatile components do not inhibit the baking.

A temperature of the baking is not particularly limited and may be appropriately selected depending on the intended purpose, so long as the temperature is equal to or higher than a temperature at which the metal elements included in the coating liquid form oxides, and the temperature is equal to or lower than a temperature at which the substrate (object to be coated) is deformed by heat. The temperature of the baking is preferably from 150 degrees Celsius through 600 degrees Celsius.

An atmosphere of the baking is not particularly limited and may be appropriately selected depending on the intended purpose. For example, an oxygen-including atmosphere (e.g., in oxygen and in the air) is preferable. The above atmospheres can oxidize and gasify organic matter and anions included in the metal sources or the solvents to be removed from the film. Moreover, when the coating liquid is baked under an atmosphere including nitrogen (e.g., in nitrogen and in an ammonia vapor), it is possible to incorporate nitrogen into the film to form the oxynitride film. As a result, the film properties such as relative dielectric constant and thermal expansion co-efficient can be controlled.

Time for the baking is not particularly limited and may be appropriately selected depending on the intended purpose.

An average thickness of each metal oxide film to be formed is not particularly limited and may be appropriately selected depending on the intended purpose. For example, an average thickness of the active layer is preferably from 1 nm through 500 nm, more preferably from 5 nm through 50 nm, particularly preferably from 10 nm through 30 nm. An average thickness of the gate insulating layer is preferably from 1 nm through 500 nm, more preferably from 10 nm through 300 nm, particularly preferably from 50 nm through 200 nm.

When the metal oxide film to be formed is an insulator, the metal oxide film preferably has no optical absorption band resulting from the electron transition in the visible light region or the near-infrared region. Due to, for example, the surface roughness of the surface of the present insulator film and the interface with the adjacent layer or the substrate and the difference of the refractive index between them, light scattering possibly causes reduction of the optical transmittance. However, the metal oxide film is intrinsically transparent. Note that, a narrow absorption band resulting from the f-f transition of lanthanoid elements may be allowed to exist.

(Field-Effect Transistor)

A field-effect transistor of the present disclosure includes at least a gate electrode, a source electrode, a drain electrode, an active layer, and a gate insulating layer, and further includes other components if necessary.

The field-effect transistor of the present disclosure can be produced by, for example, a method of the present disclosure for producing a field-effect transistor.

In the field-effect transistor, the gate insulating layer or the semiconductor film that is the active layer is the metal oxide film or the oxide stacked film.

<Gate Electrode>

The gate electrode is not particularly limited and may be appropriately selected depending on the intended purpose, so long as the gate electrode is an electrode configured to apply gate voltage.

A material of the gate electrode is not particularly limited and may be appropriately selected depending on the intended purpose. Examples of the material include metals (e.g., platinum, palladium, gold, silver, copper, zinc, aluminium, nickel, chromium, tantalum, molybdenum, and titanium), alloys of these metals, mixtures of these metals, and stacked films thereof. Moreover, examples of the material include conductive oxides (e.g., indium oxide, zinc oxide, tin oxide, gallium oxide, and niobium oxide), complex compounds of the above oxides, mixtures thereof, and stacked films thereof. An average thickness of the gate electrode is not particularly limited and may be appropriately selected depending on the intended purpose, and is preferably from 40 nm through 2 micrometers, more preferably from 70 nm through 1 micrometer.

<Gate Insulating Layer>

In one aspect, the gate insulating layer is an oxide insulator film formed between the gate electrode and the active layer and is formed of a metal oxide insulator film formed by coating the coating liquid of the present disclosure for forming a metal oxide film.

Moreover, in another aspect, the gate insulating layer is a gate insulating layer formed of the oxide insulator film, which is formed between the gate electrode and the active layer, and is the metal oxide film of the present disclosure.

An average thickness of the gate insulating layer is not particularly limited and may be appropriately selected depending on the intended purpose. The average thickness is preferably from 30 nm through 3 micrometers, more preferably from 100 nm through 1 micrometer.

<Source Electrode and Drain Electrode>

The source electrode and the drain electrode are not particularly limited and may be appropriately selected depending on the intended purpose.

A material of the source electrode and a material of the drain electrode are not particularly limited and may be appropriately selected depending on the intended purpose. Examples of these materials include the same materials as the materials exemplified in the description of the gate electrode.

An average thickness of the source electrode and the drain electrode is not particularly limited and may be appropriately selected depending on the intended purpose, and is preferably from 40 nm through 2 micrometers, more preferably from 70 nm through 1 micrometer.

<Active Layer>

In one aspect, the active layer is an active layer formed of a semiconductor film, which is formed between the source electrode and the drain electrode.

In one aspect, the active layer is an active layer formed of an oxide semiconductor layer, which is formed between the source electrode and the drain electrode, and is a metal oxide semiconductor film formed by coating the coating liquid of the present disclosure for forming a metal oxide film.

In another aspect, the active layer is an active layer formed of an oxide semiconductor layer, which is formed between the source electrode and the drain electrode, and is the metal oxide film of the present disclosure.

An average thickness of the active layer is not particularly limited and may be appropriately selected depending on the intended purpose. The average thickness of the active layer is preferably from 1 nm through 200 nm, more preferably from 5 nm through 100 nm.

A structure of the field-effect transistor is not particularly limited and may be appropriately selected depending on the intended purpose. Examples of the structure include a bottom gate/bottom contact field-effect transistor (FIG. 1), a bottom gate/top contact field-effect transistor (FIG. 2), a top gate/bottom contact field-effect transistor (FIG. 3), and a top gate/top contact field-effect transistor (FIG. 4).

Here, in FIGS. 1 to 4, the reference numeral 1 denotes a substrate, the reference numeral 2 denotes a gate electrode, the reference numeral 3 denotes a gate insulating layer, the reference numeral 4 denotes a source electrode, the reference numeral 5 denotes a drain electrode, and the reference numeral 6 denotes an active layer.

The field-effect transistor of the present disclosure can be suitably used for field-effect transistors for logic circuits and pixel drive circuits such as liquid crystal displays, organic EL displays, and electrochromic displays.

(Method for Producing Field-Effect Transistor)

A method of the present disclosure for producing a field-effect transistor is a method for producing a field-effect transistor including a gate electrode, a gate insulating layer, and an active layer with the coating liquid of the present disclosure for forming a metal oxide film.

The method includes at least one of (1), (2), and (3) below:

(1) forming an oxide semiconductor film as the active layer, by coating the coating liquid for forming a metal oxide film as a coating liquid for forming an oxide semi-conductor film on the gate insulating layer that is the oxide insulator film;

(2) forming an oxide insulator film as the gate insulating layer, by coating the coating liquid for forming a metal oxide film as a coating liquid for forming an oxide insulator film on the active layer that is the oxide semiconductor film; and (3) forming an oxide insulator film as an interlayer dielectric, by coating the coating liquid for forming a metal oxide film as a coating liquid for forming an oxide insulator film on the gate insulating layer and the gate electrode.

A method for producing the field-effect transistor (first production method) includes, for example:

a step of forming a gate electrode on a substrate;

a step of forming a gate insulating layer on the gate electrode;

a step of forming a source electrode and a drain electrode on the gate insulating layer to be spaced from each other; and a step of forming an active layer formed of a semiconductor on the gate insulating layer and in a channel region between the source electrode and the drain electrode.

A method for producing the field-effect transistor (second production method) includes, for example:

a step of forming a source electrode and a drain electrode on a substrate to be spaced from each other;

a step of forming an active layer formed of a semiconductor on the substrate and in a channel region between the source electrode and the drain electrode;

a step of forming a gate insulating layer on the active layer; and a step of forming a gate electrode on the gate insulating layer.

A method for producing the field-effect transistor (third production method) further includes, for example:

a step of forming an active layer on a substrate or a buffer layer formed on the substrate;

a step of forming a gate insulating layer on the active layer;

a step of forming a gate electrode on the gate insulating layer;

a step of forming at least one interlayer dielectric on the gate insulating layer and the gate electrode;

a step of forming through holes, which reach the active layer, through the gate insulating layer and the at least one interlayer dielectric so that the active layer is electrically connected with a source electrode and a drain electrode; and a step of forming the source electrode and the drain electrode to be spaced from each other, and to be formed on the at least one interlayer dielectric and in the through holes.

<First Production Method>

The first production method will be described hereinafter.

—Substrate—

A shape, a structure, and a size of the substrate are not particularly limited and may be appropriately selected depending on the intended purpose.

The substrate is not particularly limited and may be appropriately selected depending on the intended purpose. Examples of the substrate include glass substrates and plastic substrates.

A material of the glass substrates is not particularly limited and may be appropriately selected depending on the intended purpose. Examples of the material include alkali-free glass and silica glass.

A material of the plastic substrates is not particularly limited and may be appropriately selected depending on the intended purpose. Examples of the material include polycarbonate (PC), polyimide (PI), polyethylene terephthalate (PET), and polyethylene naphthalate (PEN).

Note that, the substrate is preferably subjected to a pre-treatment (e.g., oxygen plasma, UV-ozone, and washing through UV irradiation) in order to wash the surface of the substrate and to improve close adhesiveness.

—Step of Forming Gate Electrode—

The step of forming a gate electrode is not particularly limited and may be appropriately selected depending on the intended purpose, so long as the step is a step of forming a gate electrode on the substrate. Examples of the step include (i) a step of forming a gate electrode by forming a film through, for example, the sputtering method or the dip coating method and then patterning the film through photolithography; and (ii) a step of forming a gate electrode by directly forming a film having a desired shape through the printing process, such as inkjet printing, nanoimprinting, or gravure printing.

—Step of Forming Gate Insulating Layer—

The step of forming a gate insulating layer is not particularly limited and may be appropriately selected depending on the intended purpose, so long as the step is a step of forming a gate insulating layer on the gate electrode.

—Step of Forming Source Electrode and Drain Electrode—

The step of forming a source electrode and a drain electrode is not particularly limited and may be appropriately selected depending on the intended purpose, so long as the step is a step of forming the source electrode and the drain electrode on the gate insulating layer to be spaced from each other. Examples of the step include (i) a step of forming a source electrode and a drain electrode by forming a film through, for example, the sputtering method or the dip coating method and then patterning the film through photolithography; and (ii) a step of forming a source electrode and a drain electrode by directly forming a film having a desired shape through the printing process, such as inkjet printing, nanoimprinting, or gravure printing.

—Step of Forming Active Layer—

In one example, the step of forming an active layer is not particularly limited and may be appropriately selected depending on the intended purpose, so long as the step is a step of forming an active layer formed of a semiconductor on the gate insulating layer and in a channel region between the source electrode and the drain electrode. Examples of the step include (i) a step of forming an active layer by forming a film through, for example, the sputtering method or the dip coating method and then patterning the film through photolithography; and (ii) a step of forming an active layer by directly forming a film having a desired shape through the printing process, such as inkjet printing, nanoimprinting, or gravure printing.

In another example, the step of forming an active layer is not particularly limited and may be appropriately selected depending on the intended purpose, so long as the step is a step of coating the coating liquid of the present disclosure for forming an oxide semiconductor film on the gate insulating layer and in a channel region between the source electrode and the drain electrode to form an oxide semiconductor film that is the active layer.

In the step of forming an active layer, at least one of the carrier concentration, the crystal phase, and the crystallization temperature of the oxide semiconductor film is preferably controlled by adjusting a compositional ratio of the metal source as the solute in the coating liquid for forming a metal oxide film. This makes it possible to obtain a field-effect transistor having desired properties (e.g., threshold voltage and mobility).

In the step of forming an active layer, the coating liquid for forming a metal oxide film includes the organic solvent, and viscosity of the coating liquid for forming a metal oxide film is preferably controlled by adjusting a mixing ratio of the organic solvent in the coating liquid for forming a metal oxide film. In order to attain a desired film thickness, surface profile, and coating property, addition of the other solvents or adjustment of the concentration can be performed. When the pH is adjusted to 5 or more (for example, weak acidic to alkaline), which is one of the characteristics of the coating liquid of the present disclosure for forming a metal oxide film, the active layer can be formed without dissolving the oxide layer that is an underlayer (in the present aspect, the gate insulating layer). Therefore, it is possible to obtain a field-effect transistor excellent in coating property and having favorable conditions of the film formed.

A method for forming an oxide semiconductor by coating the coating liquid for forming a metal oxide film is not particularly limited and may be appropriately selected depending on the intended purpose. One specific example of the method is as follows. Specifically, the coating liquid for forming a metal oxide film is coated on the substrate on which the gate insulating layer has been formed. Then, the coating liquid is dried and baked to form an oxide semiconductor.

A method for the coating is not particularly limited and may be appropriately selected depending on the intended purpose. Examples of the method include the screen printing method, the roll coating method, the dip-coating method, the spin coating method, the die coating method, the inkjet method, and the nanoimprint method. Among them, the spin coating method and the die coating method are preferable because these methods are easily used in combination with the existing photolithography techniques in the production of the field-effect transistor.

The drying is not particularly limited and may be appropriately selected depending on the intended purpose, so long as volatile components in the coating liquid for forming a metal oxide film can be removed. Note that, in the drying, it is unnecessary to completely remove the volatile components, and the volatile components may be removed in such a degree that the volatile components do not inhibit the baking. A temperature of the baking is not particularly limited and may be appropriately selected depending on the intended purpose. The temperature of the baking is preferably from 150 degrees Celsius through 600 degrees Celsius.

In the first production method, the step of forming the source electrode and the drain electrode and the step of forming the active layer may be performed in any order. The step of forming the active layer may be performed after the step of forming the source electrode and the drain electrode, and the step of forming the source electrode and the drain electrode may be performed after the step of forming the active layer.

In the first production method, when the step of forming the active layer is performed after the step of forming the source electrode and the drain electrode, a bottom gate/bottom contact field-effect transistor can be produced.

In the first production method, the step of forming the source electrode and the drain electrode is performed after the step of forming the active layer, a bottom gate/top contact field-effect transistor can be produced.

Here, a method for producing a bottom gate/bottom contact field-effect transistor will be described with reference to FIGS. 5A to 5D.

First, a conductor film made of, for example, aluminium is formed on a substrate 1 made of, for example, glass through the sputtering method. Then, the thus-formed conductor film is patterned through photolithography to form a gate electrode 2 (FIG. 5A).

Next, the gate insulating layer 3 is formed on the gate electrode 2 and the substrate 1 so as to cover the gate electrode 2 (FIG. 5B).

Then, a conductor film made of, for example, ITO is formed on the gate insulating layer 3 through the sputtering method. The thus-formed conductor film is patterned through the etching to form a source electrode 4 and a drain electrode 5 (FIG. 5C).

Next, the coating liquid for forming a metal oxide film is coated on the gate insulating layer 3 through the spin coating method so as to cover a channel region formed between the source electrode 4 and the drain electrode 5. Then, the resultant is subjected to a heat treatment to form an oxide semiconductor film and the oxide semiconductor film formed is patterned through etching to form an active layer 6 (FIG. 5D).

As described above, a field-effect transistor is produced.

<Second Production Method>

The second production method will be described hereinafter.

—Substrate—

The substrate is not particularly limited and may be appropriately selected depending on the intended purpose. Examples of the substrate include the same substrate as the substrate exemplified in the description of the substrate in the first production method.

—Step of Forming Source Electrode and Drain Electrode—

The step of forming a source electrode and a drain electrode is not particularly limited and may be appropriately selected depending on the intended purpose, so long as the step is a step of forming a source electrode and a drain electrode on the substrate to be spaced from each other. Examples of the step include the same step as the step exemplified in the description of the step of forming the source electrode and the drain electrode of the first production method.

—Step of Forming Active Layer—

The step of forming an active layer is not particularly limited and may be appropriately selected depending on the intended purpose, so long as the step is a step of forming an active layer in a channel region between the source electrode and the drain electrode. Examples of the step include (i) a step of forming an active layer by forming a film through, for example, the sputtering method or the dip coating method and then patterning the film through photolithography; and (ii) a step of forming an active layer by directly forming a film having a desired shape through the printing process, such as inkjet printing, nanoimprinting, or gravure printing.

—Step of Forming Gate Insulating Layer—

The step of forming a gate insulating layer is not particularly limited and may be appropriately selected depending on the intended purpose, so long as the step is a step of forming a gate insulating layer formed of an oxide insulator by coating the coating liquid of the present disclosure for forming a metal oxide film on the active layer and on the source electrode and the drain electrode.

In the step of forming a gate insulating layer, the coating liquid for forming a metal oxide film includes the organic solvent, and viscosity of the coating liquid for forming a metal oxide film is preferably controlled by adjusting a mixing ratio of the organic solvent in the coating liquid for forming a metal oxide film. In order to attain a desired film thickness, surface profile, and coating property, addition of the other solvents or adjustment of the concentration can be performed. When the pH is adjusted to 5 or more (for example, weak acidic to alkaline), which is one of the characteristics of the coating liquid of the present disclosure for forming a metal oxide film, the gate insulating layer can be formed without dissolving the oxide layer that is an underlayer (in the present aspect, the active layer). Therefore, it is possible to obtain a field-effect transistor excellent in coating property and having favorable conditions of the film formed.

—Step of Forming Gate Electrode—

A step of forming the gate electrode is not particularly limited and may be appropriately selected depending on the intended purpose, so long as the step of forming the gate electrode is a step of forming a gate electrode on the gate insulating layer. Examples of the step include the same step as the step exemplified in the description of the step of forming the gate electrode of the first production method.

In the second production method, the step of forming the source electrode and the drain electrode and the step of forming the active layer may be performed in any order. The step of forming the active layer may be performed after the step of forming the source electrode and the drain electrode, and the step of forming the source electrode and the drain electrode may be performed after the step of forming the active layer.

In the second production method, when the step of forming the active layer is performed after the step of forming the source electrode and the drain electrode, a top gate/bottom contact field-effect transistor can be produced.

In the second production method, the step of forming the source electrode and the drain electrode is performed after the step of forming the active layer, a top gate/top contact field-effect transistor can be produced.

<Third Production Method>

Furthermore, the third production method will be described. The field-effect transistor obtained by the third production method is called a TG-ILD (top gate-interlayer dielectric) structure. One specific example thereof is a structure presented in FIG. 6. Here, in FIG. 6, the reference numeral 1 denotes a substrate, the reference numeral 2 denotes a gate electrode, the reference numeral 3 denotes a gate insulating layer, the reference numeral 4 denotes a source electrode, the reference numeral 5 denotes a drain electrode, the reference numeral 6 denotes an active layer, the reference numeral 7 denotes a first interlayer dielectric, the reference numeral 8 denotes a second interlayer dielectric, and the reference numeral 9 denotes a third interlayer dielectric.

—Substrate—

The substrate is not particularly limited and may be appropriately selected depending on the intended purpose. Examples of the substrate include the same substrate as the substrate exemplified in the description of the first production method.

—Step of Forming Active Layer—

The step of forming an active layer is not particularly limited and may be appropriately selected depending on the intended purpose, so long as the step is a step of forming an active layer on a substrate or a buffer layer formed on the substrate. Examples of the step include (i) a step of forming an active layer by forming a film through, for example, the sputtering method, the spin coating method, or the dip coating method and then patterning the film through photolithography; and (ii) a step of forming an active layer by directly forming a film having a desired shape through the printing process, such as inkjet printing, nanoimprinting, or gravure printing.

—Step of Forming Gate Insulating Layer—

The step of forming a gate insulating layer is not particularly limited and may be appropriately selected depending on the intended purpose, so long as the step is a step of coating the coating liquid of the present disclosure for forming a metal oxide film on the active layer to form an oxide insulator film that is a gate insulating layer.

—Step of Forming Gate Electrode—

The step of forming a gate electrode is not particularly limited and may be appropriately selected depending on the intended purpose, so long as the step is a step of forming the gate electrode on the gate insulating layer. Examples of the step include the same step as the step exemplified in the description of the step of forming the gate electrode of the first production method.

—Step of Forming Interlayer Dielectric—

The step of forming at least one interlayer dielectric is not particularly limited and may be appropriately selected depending on the intended purpose, so long as the step is a step of forming the at least one interlayer dielectric on the gate insulating layer and the gate electrode. Examples of the step of forming at least one interlayer dielectric include (i) a step of forming at least one interlayer dielectric by forming a film through, for example, the sputtering method, the CVD method, or the spin coating method and then patterning the film through photolithography; and (ii) a step of forming at least one interlayer dielectric by directly forming a film having a desired shape through the printing process, such as inkjet printing, nanoimprinting, or gravure printing.

The interlayer dielectric may be a single layer or a multilayer.

As a step of forming the interlayer dielectric through printing, it is possible to use a step of forming the at least one interlayer dielectric formed of the oxide insulator by coating the coating liquid of the present disclosure for forming a metal oxide film. The step can be selected depending on the intended purpose.

—Step of Forming Through Holes—

The step of forming through holes is not particularly limited and may be appropriately selected depending on the intended purpose, so long as the step is a step of forming through holes, which reach the active layer, through the gate insulating layer and the at least one interlayer dielectric so that the active layer is electrically connected with the source electrode and the drain electrode.

—Step of Forming Source Electrode and Drain Electrode—

The step of forming a source electrode and a drain electrode is not particularly limited and may be appropriately selected depending on the intended purpose, so long as the step is a step of forming the source electrode and the drain electrode to be spaced from each other, and to be formed on the interlayer dielectric and in the through holes. Examples of the step include the same step as the step exemplified in the description of the step of forming the source electrode and the drain electrode of the first production method. In this step, the active layer is electrically connected with the source electrode and the drain electrode.

(Semiconductor Element)

In one aspect, a semiconductor element of the present disclosure includes at least one of the metal oxide film and the oxide stacked film of the present disclosure.

In another aspect of the semiconductor element of the present disclosure, the metal oxide film of the present disclosure is included in at least one of the active layer and the insulating layer.

Examples of the insulating layer include a gate insulating layer and an interlayer dielectric.

<Active Layer, Insulating Layer>

The active layer and the insulating layer, which are not particularly limited and may be appropriately selected depending on the intended purpose, preferably have the metal oxide film of the present disclosure.

A structure, a shape, and a size of the active layer and the insulating layer are not particularly limited and may be appropriately selected depending on the intended purpose.

Examples of the semiconductor element include diodes, field-effect transistors, light emitting elements, and photoelectric converting elements.

<Diode>

The diode is not particularly limited and may be appropriately selected depending on the intended purpose. The diode is, for example, a diode including a first electrode, a second electrode, the active layer formed between the first electrode and the second electrode, and the insulating layer. Examples of the aforementioned diode include PIN photodiodes.

——PIN Junction Diode——

The PIN junction diode includes at least the active layer and the insulating layer, and further includes the other components such as an anode (positive electrode) and a cathode (negative electrode) if necessary.

————Active Layer————

The active layer includes at least a p-type semiconductor layer and an n-type semiconductor layer, and further includes other components if necessary.

The p-type semiconductor layer and the n-type semiconductor layer are in contact with each other via the insulating layer.

——————P-Type Semiconductor Layer——————

The p-type semiconductor layer is not particularly limited and may be appropriately selected depending on the intended purpose and is preferably the metal oxide film of the present disclosure.

An average thickness of the p-type semiconductor layer is not particularly limited and may be appropriately selected depending on the intended purpose. The average thickness of the p-type semiconductor layer is preferably from 50 nm through 2,000 nm.

——————N-Type Semiconductor Layer——————

The n-type semiconductor layer is not particularly limited and may be appropriately selected depending on the intended purpose and is preferably the metal oxide film of the present disclosure.

An average thickness of the n-type semiconductor layer is not particularly limited and may be appropriately selected depending on the intended purpose. The average thickness of the n-type semiconductor layer is preferably from 50 nm through 2,000 nm.

——————Insulating Layer——————

The insulating layer is not particularly limited and may be appropriately selected depending on the intended purpose and is preferably the metal oxide film of the present disclosure.

An average thickness of the insulating layer is not particularly limited and may be appropriately selected depending on the intended purpose. The average thickness of the insulating layer is preferably from 50 nm through 2,000 nm.

————Anode (Positive Electrode)————

The anode contacts with the p-type semiconductor layer.

A material of the anode is not particularly limited and may be appropriately selected depending on the intended purpose. Examples of the material include metals (e.g., Mo, Al, Au, Ag, and Cu) and alloys of the metals, transparent conductive oxides such as indium tin oxide (ITO) and antimony-doped tin oxide (ATO), and organic conductors such as polyethylenedioxythiophene (PEDOT) and polyaniline (PANI).

A shape, a size, and a structure of the anode are not particularly limited and may be appropriately selected depending on the intended purpose.

The anode is provided to be in contact with the p-type semiconductor layer. An ohmic contact is preferably formed between the anode and the p-type semiconductor layer.

A method for forming the anode is not particularly limited and may be appropriately selected depending on the intended purpose. Examples of the method include (i) a method for forming the anode by forming a film through, for example, the sputtering method or the dip coating method and then patterning the film through photolithography; and (ii) a method for forming the anode by directly forming a film having a desired shape through the printing process, such as inkjet printing, nanoimprinting, or gravure printing.

————Cathode (Negative Electrode)————

A material of the cathode is not particularly limited and may be appropriately selected depending on the intended purpose. Examples of the material include the same material as the material exemplified in the description of the anode.

A shape, a size, and a structure of the cathode are not particularly limited and may be appropriately selected depending on the intended purpose.

The cathode is provided to be in contact with the n-type semiconductor layer. An ohmic contact is preferably formed between the cathode and the n-type semiconductor layer.

A method for forming the cathode is not particularly limited and may be appropriately selected depending on the intended purpose. Examples of the method include the same method as the method exemplified in the description of the anode.

EXAMPLES

The present disclosure will next be described by way of Examples, but the present disclosure should not be construed as being limited to these Examples.

Example 1-1

<Preparation of Coating Liquid for Forming Oxide Insulator Film>

Lanthanum nitrate hexahydrate (0.16 mol) and calcium nitrate tetrahydrate (0.008 mol) were weighed. Then, ethylene glycol monomethyl ether (250 mL), 1,2-propylene glycol (250 mL), methanol (500 mL), and monoethanolamine (700 mL) were added and dissolved therein to prepare a coating liquid for forming an oxide insulator film. The pH measured was 11.67.

Examples 1-2 to 1-16

Coating liquids of Examples 1-2 to 1-16 for forming an oxide insulator film were prepared in the same manner as in Example 1-1 except that the material formulation of Example 1-1 was changed to each material formulation presented in Tables 1-1 and 1-2.

TABLE 1-1

| Ex. | Coating liquid No | Solute A | | Solute B | | Solute C | |
|---|---|---|---|---|---|---|---|
| | | Solute | Amount mol | Solute | Amount mol | Solute | Amount mol |
| 1-1 | 1 | $La(NO_3)_3 \cdot 6H_2O$ | 0.16 | $Ca(NO_3)_2 \cdot 4H_2O$ | 0.008 | | |
| 1-2 | 2 | $La(NO_3)_3 \cdot 6H_2O$ | 0.2 | $MgCl_2 \cdot 6H_2O$ | 0.01 | $ZrCl_4$ | 0.01 |
| 1-3 | 3 | $LaCl_3 \cdot 7H_2O$ | 0.2 | $CaCl_2 \cdot 2H_2O$ | 0.01 | $HfCl_4$ | 0.01 |
| 1-4 | 4 | $Y(NO_3)_3 \cdot 6H_2O$ | 0.4 | $BaCl_2 \cdot 2H_2O$ | 0.01 | $ZrCl_4$ | 0.02 |
| 1-5 | 5 | $YCl_3 \cdot 6H_2O$ | 2.0 | $Mg(NO_3)_2 \cdot 6H_2O$ | 0.1 | $ZrCl_4$ | 0.1 |

TABLE 1-1-continued

| | | | | | | | |
|---|---|---|---|---|---|---|---|
| 1-6 | 6 | La(NO$_3$)$_3$•6H$_2$O | 1.2 | SrCl$_2$•6H$_2$O | 0.08 | HfCl$_4$ | 0.06 |
| 1-7 | 7 | LaAc$_3$•1.5H$_2$O | 1.0 | CaAc$_2$•H$_2$O | 0.125 | ZrOAc$_2$ | 0.5 |
| 1-8 | 8 | SbAc$_3$ | 0.3 | SrAc$_2$•0.5H$_2$O | 0.2 | ZrOAc$_2$ | 0.5 |
| 1-9 | 9 | Bi(C$_8$H$_{15}$O$_2$)$_3$ | 0.65 | Mg(C$_8$H$_{15}$O$_2$)$_2$ | 0.05 | ZrO(C$_8$H$_{15}$O$_2$)$_2$ | 0.3 |
| 1-10 | 10 | LuAc$_3$•4H$_2$O | 0.6 | MgAc$_2$•4H$_2$O | 0.1 | Ti(acac)$_2$(OiPr)$_2$ | 0.5 |
| 1-11 | 11 | TeCl$_3$ | 0.6 | Ba(OH)$_2$•8H$_2$O | 0.15 | GaCl$_2$ | 0.25 |
| 1-12 | 12 | | | Mg(NO$_3$)$_2$•6H$_2$O | 0.3 | | |
| 1-13 | 13 | YCl$_3$•6H$_2$O | 0.1 | | | | |
| 1-14 | 14 | | | | | Al(NO$_3$)$_3$•9H$_2$O | 0.4 |
| | | | | | | Gal(NO$_3$)$_3$•8H$_2$O | 0.4 |
| 1-15 | 15 | | | | | Ti(SO$_4$)$_2$•6H$_2$O | 0.2 |
| 1-16 | 16 | | | | | | |

| | Solute D | | Solute E | |
|---|---|---|---|---|
| Ex. | Solute | Amount mol | Solute | Amount mol |
| 1-1 | | | | |
| 1-2 | | | | |
| 1-3 | | | | |
| 1-4 | | | | |
| 1-5 | | | | |
| 1-6 | | | | |
| 1-7 | | | | |
| 1-8 | | | | |
| 1-9 | | | | |
| 1-10 | | | | |
| 1-11 | | | | |
| 1-12 | In(NO$_3$)$_2$•3H$_2$O | 0.6 | SnCl$_4$•5H$_2$O | 0.01 |
| 1-13 | InCl$_3$•4$_2$O | 0.9 | ZrO(NO$_3$)$_2$•2H$_2$O | 0.02 |
| 1-14 | Cd(NO$_3$)$_3$•4H$_2$O | 0.4 | W(CO)$_6$ | 0.01 |
| 1-15 | ZnSO$_4$•7H$_2$O | 0.4 | NbCl$_2$ | 0.02 |
| 1-16 | ZnCl$_2$ | 0.6 | Re$_2$O$_7$ | 0.01 |
| | SnCl$_4$•5H$_2$O | 0.3 | | |

TABLE 1-2

| Ex. | Coating liquid No | Solvent F Kind | mL | Solvent G Kind | mL | Solvent H Kind | mL | Solvent J Kind | mL | Solvent K Kind | mL | pH |
|---|---|---|---|---|---|---|---|---|---|---|---|---|
| 1-1 | 1 | EGME | 250 | PG | 250 | | | MeOH | 500 | MEA | 700 | 11.67 |
| 1-2 | 2 | EGME | 220 | EG | 220 | | | MeOH | 400 | MEA | 80 | 9.87 |
| 1-3 | 3 | EGIPE | 110 | EG | 235 | | | EtOH | 300 | DMAE | 40 | 8.57 |
| 1-4 | 4 | EGIPE | 220 | PG | 420 | H$_2$O | 100 | EtOH | 550 | NEDEA | 30 | 7.22 |
| 1-5 | 5 | EGME | 550 | PG | 1850 | H$_2$O | 500 | MeOH | 1440 | DMAE | 60 | 6.33 |
| 1-6 | 6 | EGIPE | 660 | EG | 1260 | H$_2$O | 300 | IPA | 1650 | NMDEA | 30 | 5.39 |
| 1-7 | 7 | DMSO | 2000 | EG | 3000 | H$_2$O | 3500 | c-PeOH | 1000 | TMAH | 200 | 10.56 |
| 1-8 | 8 | DMI | 1000 | EG | 1000 | H$_2$O | 2000 | 2-BuOH | 2000 | DBU | 50 | 9.32 |
| 1-9 | 9 | EHA | 2500 | | | | | 2-HexOH | 2500 | MEA | 20 | 8.24 |
| 1-10 | 10 | NMP | 1000 | PG | 1000 | H$_2$O | 3000 | IPA | 2000 | Choline | 40 | 9.54 |
| 1-11 | 11 | GBL | 500 | EG | 1000 | H$_2$O | 1000 | EtOH | 2000 | TEA | 30 | 7.43 |
| 1-12 | 12 | NMP | 1500 | PG | 1500 | H$_2$O | 1000 | MeOH | 2000 | MEA | 600 | 11.56 |
| 1-13 | 13 | EGME | 1000 | EG | 2000 | H$_2$O | 1000 | IPA | 2000 | NMDEA | 350 | 9.81 |
| 1-14 | 14 | GBL | 1000 | EG | 1850 | H$_2$O | 1000 | MeOH | 2500 | NMEA | 250 | 8.79 |
| 1-15 | 15 | DMSO | 1500 | PG | 1350 | H$_2$O | 2000 | EtOH | 1000 | DEGA | 40 | 6.12 |
| 1-16 | 16 | EGBE | 2000 | EG | 2000 | H$_2$O | 1000 | 2-BuOH | 1000 | DEA | 100 | 5.24 |

In Table 1-1, Table 1-2, Table 2-1, and Table 2-2, names of the materials and the solvents are as follows. Note that, the solvent K is alkali.

<Solute A>
La(NO$_3$)$_3$.6H$_2$O: Lanthanum nitrate hexahydrate
Y(NO$_3$)$_3$.6H$_2$O: Yttrium nitrate hexahydrate
LaCl$_3$.7H$_2$O: Lanthanum chloride heptahydrate
YCl$_3$.6H$_2$O: Yttrium chloride hexahydrate
LaAc$_3$.1.5H$_2$O: Lanthanum acetate sesquihydrate
SbAc$_3$: Antimony acetate
Bi(C$_8$H$_{15}$O$_2$)$_3$: Bismuth 2-ethylhexanoate
LuAc$_3$.4H$_2$O: Lutetium acetate tetrahydrate
TeCl$_3$: Tellurium chloride <Solute B>
Ca(NO$_3$)$_3$.4H$_2$O: Calcium nitrate tetrahydrate
CaCl$_2$.2H$_2$O: Calcium chloride dehydrate
BaCl$_2$.2H$_2$O: Barium chloride dehydrate
Mg(NO$_3$)$_2$.6H$_2$O: Magnesium nitrate hexahydrate
MgCl$_2$.6H$_2$O: Magnesium chloride hexahydrate
SrCl$_2$.6H$_2$O: Strontium chloride hexahydrate
CaAc$_2$.H$_2$O: Calcium acetate monohydrate
SrAc$_2$.0.5H$_2$O: Strontium acetate hemihydrate
Mg(C$_8$H$_{15}$O$_2$)$_2$: Magnesium 2-ethylhexanoate
MgAc$_2$.4H$_2$O: Magnesium acetate tetrahydrate Ba(OH)$_2$.8H$_2$O: Barium hydroxide octahydrate
<Solute C>
ZrCl$_4$: Zirconium chloride
HfCl$_4$: Hafnium chloride
ZrOAc$_2$: Zirconyl acetate
ZrO(C$_8$H$_{15}$O2)$_2$: Zirconium oxide 2-ethylhexanoate
Ti(acac)$_2$OiPr$_2$: Titanium diisopropoxide bis(acetylacetonate)
GaCl$_3$: Gallium chloride
Al(NO$_3$)$_3$.9H$_2$O: Aluminium nitrate nonahydrate
Ga(NO$_3$)$_3$.8H$_2$O: Gallium nitrate octahydrate
Ti(SO$_4$)$_2$.6H$_2$O: Titanium sulfate heptahydrate
<Solute D>
In(NO$_3$)$_3$.3H$_2$O: Indium nitrate trihydrate
InCl$_3$.4H$_2$O: Indium chloride tetrahydrate
Cd(NO$_3$)$_2$.4H$_2$O: Cadmium nitrate tetrahydrate
ZnSO$_4$.7H$_2$O: Zinc sulfate heptahydrate
ZnCl$_2$: Zinc chloride
SnCl$_4$.5H$_2$O: Tin chloride pentahydrate
<Solute E>
SnCl$_4$.5H$_2$O: Tin chloride pentahydrate
ZrO(NO$_3$)$_2$.2H$_2$O: Zirconyl nitrate dihydrate
W(CO)$_6$: Tungsten carbonyl
NbCl$_5$: Niobium chloride
Re$_2$O$_7$: Rhenium oxide
<Solvent F>
EGME: Ethylene glycol monomethyl ether
EGIPE: Ethylene glycol monoisopropyl ether
EHA: 2-Ethylhexanoic acid
DMSO: Dimethyl sulfoxide
DMI: 1,3-Dimethyl-2-imidazolidinone
NMP: N-methylpyrrolidone
GBL: γ-Butyrolactone
EGBE: Ethylene glycol monobutyl ether <Solvent G>
PG: Propylene glycol
EG: Ethylene glycol
<Solvent H>
H$_2$O: Water
<Solvent I>
IPA: Isopropanol
EtOH: Ethanol
MeOH: Methanol
c-PeOH: Cyclopentanol
2-BuOH: 2-Butanol
2-HexOH: 2-Hexanol
<Solvent K>
MEA: Monoethanolamine
DMAE: Dimethylaminoethanol
NMDEA: N-Methyldiethanolamine
NEDEA: N-Ethyldiethanolamine
TMAH: Tetramethylammonium hydroxide (10% in Methanol)
Choline: 2-Hydroxyethyltrimethylammonium hydroxide (5% in water)
DBU: 1,8-Diazabicyclo[5.4.0]-7-undecene
TEA: Triethanolamine
DEGA: Diethylene glycolamine
NMEA: N-Methylethanolamine
DEA: Diethanolamine Comparative Examples C1-1 to C1-10

Coating liquids of Comparative Examples C1-1 to C1-10 were prepared in the same manner as in Examples 1-1 to 1-16 except that each of the material formulations of Examples 1-1 to 1-16 was changed to each material formulation presented in Table 2-1 and Table 2-2.

TABLE 2-1

| Comp. Ex. | Coating liquid No | Solute A | | Solute B | | Solute C | |
|---|---|---|---|---|---|---|---|
| | | Solute | Amount mol | Solute | Amount mol | Solute | Amount mol |
| C1-1 | C1 | La(NO$_3$)$_3$•6H$_2$O | 0.16 | Ca(NO$_3$)$_2$•4H$_2$O | 0.008 | | |
| C1-2 | C2 | YCl$_3$•6H$_2$O | 0.2 | SrCl$_2$•6H$_2$O | 0.01 | HfCl$_4$ | 0.01 |
| C1-3 | C3 | La(NO$_3$)$_3$•6H$_2$O | 0.4 | CaCl$_2$•2H$_2$O | 0.02 | ZrCl$_4$ | 0.01 |
| C1-4 | C4 | LaCl$_2$•7H$_2$O | 0.4 | BaCl$_2$•2H$_2$O | 0.015 | ZrCl$_4$ | 0.01 |
| C1-5 | C5 | LaAc$_3$•1.5H$_2$O | 0.4 | MgCl$_2$•6H$_2$O | 0.02 | | |
| C1-6 | C6 | Y(NO$_2$)$_3$•6H$_2$O | 0.5 | SrAc$_2$•0.5H$_2$O | 0.05 | ZrOAc$_2$ | 0.05 |
| C1-7 | C7 | | | Mg(NO$_3$)$_2$•6H$_2$O | 0.33 | | |
| C1-8 | C8 | | | | | | |
| C1-9 | C9 | LaCl$_2$•7H$_2$O | 0.2 | | | | |
| C1-10 | C10 | | | | | Ga(NO$_3$)$_3$•8H$_2$O | 0.3 |

| Comp. Ex. | Solute D | | Solute E | |
|---|---|---|---|---|
| | Solute | Amount mol | Solute | Amount mol |
| C1-1 | | | | |
| C1-2 | | | | |
| C1-3 | | | | |
| C1-4 | | | | |
| C1-5 | | | | |
| C1-6 | | | | |
| C1-7 | In(NO$_3$)$_2$•3H$_2$O | 0.66 | SnCl$_4$•5H$_2$O | 0.01 |
| C1-8 | InCl$_3$•4H$_2$O | 0.5 | | |
| | ZnAc$_2$•H$_2$O | 0.5 | | |
| C1-9 | InCl$_3$•4H$_2$O | 0.8 | | |
| C1-10 | In(NO$_3$)$_3$•3H$_2$O | 0.5 | ZrO(NO$_2$)$_3$•2H$_2$O | 0.2 |

TABLE 2-2

| Comp. Ex. | Coating liquid No | Solvent F Kind | mL | Solvent G Kind | mL | Solvent H Kind | mL | Solvent J Kind | mL | Solvent K Kind | mL | pH |
|---|---|---|---|---|---|---|---|---|---|---|---|---|
| C1-1 | C1 | EGME | 250 | PG | 250 | | | MeOH | 500 | | | 2.91 |
| C1-2 | C2 | EGME | 215 | EG | 225 | $H_2O$ | 50 | IPA | 400 | | | 0.67 |
| C1-3 | C3 | EGIPE | 410 | PG | 470 | | | EtOH | 440 | | | 1.73 |
| C1-4 | C4 | EGIPE | 460 | EG | 420 | $H_2O$ | 100 | EtOH | 440 | | | 0.17 |
| C1-5 | C5 | EGIPE | 360 | PG | 720 | $H_2O$ | 720 | IPA | 720 | | | 4.56 |
| C1-6 | C6 | EGME | 750 | PG | 1000 | $H_2O$ | 1000 | MeOH | 750 | | | 3.33 |
| C1-7 | C7 | NMP | 1500 | PG | 1500 | $H_2O$ | 1000 | MeOH | 2000 | | | 2.24 |
| C1-8 | C8 | DMSO | 1000 | EG | 1375 | $H_2O$ | 1000 | MeOH | 2000 | | | 3.95 |
| C1-9 | C9 | EGIPE | 1000 | PG | 1350 | $H_2O$ | 650 | c-PeOH | 2000 | | | 0.79 |
| C1-10 | C10 | EGME | 1500 | EG | 2000 | $H_2O$ | 500 | MeOH | 2000 | | | 1.28 |

Example 2-1

Using a spin coater, the coating liquid 1 in Table 1-1 and Table 1-2 was printed on an alkali-free glass substrate that had been subjected to UV ozone cleaning. The printing property was favorable. The substrate was dried for 10 minutes on a hot plate, which had been heated at 120 degrees Celsius and was baked at 400 degrees Celsius for 1 hour in an air atmosphere to obtain a transparent oxide film.

Examples 2-2 to 2-16

In the same manner as in Example 2-1, each of the coating liquids 2 to 16 in Tables 1-1 and 1-2 was subjected to printing/drying/baking to obtain a similar transparent oxide film. All of the coating liquids exhibited favorable printing properties similar to the coating liquid in Example 2-1.

Examples 2-2 to 2-16 correspond to the coating liquids 2 to 16 as follows.
Example 2-2: Coating liquid 2
Example 2-3: Coating liquid 3
Example 2-4: Coating liquid 4
Example 2-5: Coating liquid 5
Example 2-6: Coating liquid 6
Example 2-7: Coating liquid 7
Example 2-8: Coating liquid 8
Example 2-9: Coating liquid 9
Example 2-10: Coating liquid 10
Example 2-11: Coating liquid 11
Example 2-12: Coating liquid 12
Example 2-13: Coating liquid 13
Example 2-14: Coating liquid 14
Example 2-15: Coating liquid 15
Example 2-16: Coating liquid 16

Example 3-1

On an alkali-free glass substrate that had been subjected to UV ozone cleaning, Al (100 nm) as a bottom electrode was deposited through a mask. The coating liquid 1 of Table 1-1 and Table 1-2 was printed thereon through the spin coating. The film formation property was favorable. The substrate was dried at 120 degrees Celsius for 1 hour in an air atmosphere in an oven and was baked at 400 degrees Celsius for 1 hour in an air atmosphere to obtain an oxide insulator film. Subsequently, Al (100 nm) as an upper electrode was deposited through a mask to form a capacitor structure.

FIG. 7 presents a relationship between relative dielectric constant E of the capacitor produced in the Example and frequency of the applied electric field, and a relationship between dielectric loss tans of the capacitor produced in the Example and the frequency of the applied electric field. As presented in FIG. 7, it was confirmed that the relative dielectric constant E of the capacitor produced in the Example was 10.4 or more and had a high relative dielectric constant, in a region of from 100 Hz to 1 MHz. It was confirmed that the values of the dielectric loss tans were low values of about 2% or less at from 100 Hz to 100 kHz.

Example 4-1

<Preparation of Field-Effect Transistor>
—Formation of Active Layer—

An alkali-free glass substrate was subjected to the ultrasonic cleansing with a neutral detergent, pure water, and isopropyl alcohol. The substrate was dried and was subjected to an UV-ozone treatment at 90 degrees Celsius for 10 minutes. On the alkali-free glass substrate, the coating liquid 12 in Tables 1-1 and 1-2 was coated by a spin coater. The resultant was dried at 120 degrees Celsius for 1 hour in an air atmosphere and was baked at 400 degrees Celsius for 1 hour in an air atmosphere to obtain an n-type oxide semiconductor film. Then, an active layer having a desired shape was obtained through photolithography.

—Formation of Source Electrode and Drain Electrode—

Next, a film of an aluminum alloy (100 nm) was formed thereon through the DC magnetron sputtering method and was patterned through photolithography to form a source electrode and a drain electrode. Here, a channel width defined by length of the source and drain electrodes was set to 30 micrometers and a channel length defined by a spacing between the source electrode and the drain electrode was set to 10 micrometers.

—Formation of Gate Insulating Layer—

Then, the coating liquid 1 was coated by a spin coater.

The substrate was dried for 10 minutes on a hot plate that had been heated at 120 degrees Celsius and was baked at 400 degrees Celsius for one hour in an air atmosphere to obtain a gate insulating layer. An average thickness of the gate insulating layer obtained was about 130 nm.

—Formation of Gate Electrode—

A film of Mo (100 nm) was formed through the DC magnetron sputtering method and was patterned through photolithography to form a gate electrode.

—Formation of Electrode Pads—

Next, through holes were patterned through the gate insulating layer through the photolithography method to form electrode pads of the source electrode and the drain electrode.

Finally, annealing was performed at 250 degrees Celsius for one hour in an air atmosphere.

As described above, a field-effect transistor was produced.

Examples 4-2 to 4-11

A field-effect transistor was produced in the same manner as in Example 4-1 except that the coating liquid 1 was changed to each of the coating liquids described below.
Example 4-2: Coating liquid 2
Example 4-3: Coating liquid 3
Example 4-4: Coating liquid 4
Example 4-5: Coating liquid 5
Example 4-6: Coating liquid 6
Example 4-7: Coating liquid 7
Example 4-8: Coating liquid 8
Example 4-9: Coating liquid 9
Example 4-10: Coating liquid 10
Example 4-11: Coating liquid 11

Comparative Examples C4-1 to C4-6

A field-effect transistor was produced in the same manner as in Example 4-1 except that the coating liquid 1 was changed to each of the coating liquids described below.
Comparative Example C4-1: Coating liquid C1
Comparative Example C4-2: Coating liquid C2
Comparative Example C4-3: Coating liquid C3
Comparative Example C4-4: Coating liquid C4
Comparative Example C4-5: Coating liquid C5
Comparative Example C4-6: Coating liquid C6
<Evaluation>
—Carrier Mobility and On/Off Ratio—

In the field-effect transistor obtained, a semiconductor parameter•analyzer apparatus (available from Agilent Technologies, semiconductor parameter•analyzer B1500A) was used to determine a relationship between the gate voltage Vgs and the source•drain electric current Ids when the source•drain voltage Vds was 10 V. Results of Example 4-1 are presented in the graph of FIG. 8. From FIG. 8, it can be confirmed that favorable transistor characteristics are obtained. Note that, in FIG. 8, "E" represents "exponentiation of 10". For example, "1E-04" means "0.0001".

Characteristics calculated from FIG. 8 exhibited considerably favorable characteristics (i.e., $\mu$=12.1 cm$^2$/Vs, Vth=1.48 V, Vss=0.18 V/dec, |Ig|~1×10$^{-14}$ A).

Each of the field-effect transistors (Examples 4-1 to 4-11) including the oxide insulator as the gate insulating layer, which was obtained by coating each coating liquid of the present disclosure for forming a metal oxide film (coating liquid for forming an oxide insulator film), exhibited favorable transistor characteristics such as high carrier mobility and large on/off ratio even at a process temperature of about 400 degrees Celsius.

Shapes of the active layers after formation of the gate insulating films in the field-effect transistors of Example 4-1 and Comparative Example C4-1 are presented in FIG. 9 and FIG. 10. In FIG. 9, the shape of the active layer presented a favorable shape after the gate insulating film was formed. Meanwhile, in FIG. 10, the shape of the active layer became obscure. From the above, it is shown in Comparative Example C4-1 that the active layer was dissolved when the gate insulating layer was formed. The field-effect transistor of Comparative Example C4-1 did not work as the TFT because the Ids as the TFT characteristic did not flow.

The field-effect transistors of Examples 4-2 to 4-11 exhibited the same tendencies as the tendencies exhibited in the field-effect transistor of Example 4-1.

Note that, the field-effect transistors of Comparative Examples C4-2 to C4-6 exhibited the same tendencies as the tendencies exhibited in the field-effect transistor of Comparative Example C4-1.

Example 5-1

<Formation of Oxide Stacked Film>
—Formation of Oxide Insulator Layer—

An alkali-free glass substrate was subjected to the ultrasonic cleansing with a neutral detergent, pure water, and isopropyl alcohol. The substrate was dried and was subjected to an UV-ozone treatment at 90 degrees Celsius for 10 minutes. On the alkali-free glass substrate, the coating liquid 1 in Tables 1-1 and 1-2 was coated by a spin coater. The resultant was dried at 120 degrees Celsius for 1 hour in an air atmosphere and was baked at 400 degrees Celsius for 1 hour in an air atmosphere to obtain an oxide insulator film. Then, an oxide insulator layer having a desired shape was obtained through photolithography.
—Formation of Oxide Semiconductor Layer (Active Layer)—

Then, the coating liquid 12 was coated by a spin coater. The substrate was dried for 10 minutes on a hot plate that had been heated at 120 degrees Celsius and was baked at 400 degrees Celsius for one hour in an air atmosphere to obtain an oxide semiconductor film.

Examples 5-2 to 5-5

An oxide stacked film was produced in the same manner as in Example 5-1 except that the coating liquid 12 was changed to each coating liquid below.
Example 5-2: Coating liquid 13
Example 5-3: Coating liquid 14
Example 5-4: Coating liquid 15
Example 5-5: Coating liquid 16

Comparative Examples C5-1 to C5-4

An oxide stacked film was produced in the same manner as in Example 5-1 except that the coating liquid 12 was changed to each coating liquid below.
Comparative Example C5-1: Coating liquid C7
Comparative Example C5-2: Coating liquid C8
Comparative Example C5-3: Coating liquid C9
Comparative Example C5-4: Coating liquid C10

Shapes of oxide stacked films of Example 5-1 and Comparative Example C5-1 are presented in FIG. 11 and FIG. 12. In Example 5-1, as seen from the shape of the through holes in FIG. 11, it was exhibited that the shape of the oxide insulating layer was favorable even after formation of the oxide semiconductor film. Meanwhile, in Comparative Example C5-1, the shapes of the through holes of the oxide insulating layer were unclear as presented in FIG. 12. This exhibits that the oxide insulating layer was dissolved when the oxide semiconductor film was formed in Comparative Example C5-1.

The oxide stacked films of Examples 5-2 to 5-5 exhibited the same tendencies as the tendencies exhibited in the oxide stacked film of Example 5-1.

The oxide stacked films of Comparative Examples C5-2 to C5-4 exhibited the same tendencies as the tendencies exhibited in the oxide stacked film of Comparative Example C5-1.

As described above, the field-effect transistor produced in the present disclosure is suitable for enlarging process margin and stabilizing the TFT characteristics at a high level. The display element of the present disclosure is capable of driving at a high speed and is suitable for decreasing unevenness between the elements and improving reliability.

Aspects of the present disclosure are as follows, for example.

<1> A coating liquid for forming a metal oxide film, the coating liquid including:
a metal source, which is at least one selected from the group consisting of inorganic salts, oxides, hydroxides, metal complexes, and organic acid salts;
at least one alkali selected from the group consisting of organic alkalis and inorganic alkalis; and
a solvent.

<2> The coating liquid for forming a metal oxide film according to <1>, wherein a pH of the coating liquid for forming a metal oxide film is 5 or more.

<3> The coating liquid for forming a metal oxide film according <1> or <2>, wherein the pH of the coating liquid for forming a metal oxide film is 6 or more but 12 or less.

<4> The coating liquid for forming a metal oxide film according to any one of <1> to <3>,
wherein the pH of the coating liquid for forming a metal oxide film is 6.5 or more but 11 or less.

<5> The coating liquid for forming a metal oxide film according to any one of <1> to <4>,
wherein the alkali includes at least one selected from the group consisting of quaternary ammonium salts and quaternary ammonium hydroxides.

<6> The coating liquid for forming a metal oxide film according to any one of <1> to <4>,
wherein the alkali includes aminoalcohol.

<7> The coating liquid for forming a metal oxide film according to <6>,
wherein the aminoalcohol includes at least one selected from the group consisting of dialkanolamines and trialkanolamines.

<8> The coating liquid for forming a metal oxide film according to any one of <1> to <7>,
wherein the inorganic salt includes at least one selected from the group consisting of nitrates, sulfates, chlorides, carbonates, acetates, and phosphates.

<9> The coating liquid for forming a metal oxide film according to any one of <1> to <7>,
wherein the organic acid salt includes at least one selected from the group consisting of carboxylates, phenols, and derivatives thereof.

<10> The coating liquid for forming a metal oxide film according to any one of <1> to <9>,
wherein the solvent includes at least one selected from the group consisting of organic acids, organic acid esters, aromatic compounds, diols, glycol ethers, polar aprotic solvents, alkane compounds, alkene compounds, ethers, alcohols, and water.

<11> The coating liquid for forming a metal oxide film according to any one of <1> to <10>,
wherein the metal source includes at least one Group A element selected from the group consisting of rare earth elements, Bi, Te, and Sb.

<12> The coating liquid for forming a metal oxide film according to any one of <1> to <11>,
wherein the metal source includes at least one Group B element selected from the group consisting of Mg, Ca, Sr, and Ba.

<13> The coating liquid for forming a metal oxide film according to any one of <1> to <12>,
wherein the metal source includes at least one Group C element selected from the group consisting of Ti, Zr, Hf, Al, and Ga.

<14> The coating liquid for forming a metal oxide film according to any one of <1> to <13>,
wherein the metal source includes at least one Group D element selected from the group consisting of Zn, Cd, Ga, In, Tl, Sn, and Pb.

<15> The coating liquid for forming a metal oxide film according to any one of <1> to <14>,
wherein the metal source includes at least one Group E element selected from the group consisting of Ti, Zr, Hf, Sn, Nb, Ta, Mo, W, and Re.

<16> The coating liquid for forming a metal oxide film according to any one of <1> to <15>,
wherein an electron configuration of a metal ion included in the metal source is a closed-shell.

<17> The coating liquid for forming a metal oxide film according to any one of <1> to <16>,
wherein the coating liquid for forming a metal oxide film is transparent or light yellow.

<18> A method for producing a metal oxide film, the method including: coating the coating liquid for forming a metal oxide film according to any one of <1> to <17> on an object to be coated and drying the coating liquid, followed by baking.

<19> A method for producing a field-effect transistor including a gate electrode, a gate insulating layer, and an active layer with the coating liquid for forming a metal oxide film according to any one of <1> to <17>, the method including: at least one of (1), (2), and (3) below:

(1) forming an oxide semiconductor film as the active layer, by coating the coating liquid for forming a metal oxide film as a coating liquid for forming an oxide semiconductor film on the gate insulating layer that is the oxide insulator film;

(2) forming an oxide insulator film as the gate insulating layer, by coating the coating liquid for forming a metal oxide film as a coating liquid for forming an oxide insulator film on the active layer that is the oxide semiconductor film; and (3) forming an oxide insulator film as an interlayer dielectric, by coating the coating liquid for forming a metal oxide film as a coating liquid for forming an oxide insulator film on the gate insulating layer and the gate electrode.

<20> A metal oxide film, which is a baked product of the coating liquid for forming a metal oxide film according to any one of <1> to <17>.

<21> The metal oxide film according to <20>,
wherein the metal oxide film has no optical absorption band resulting from an electron transition in a visible light region or a near-infrared region.

<22> An oxide stacked film including:
an oxide film; and
a baked product of the coating liquid for forming a metal oxide film according to any one of <1> to <17> on the oxide film.

<23> The oxide stacked film according to <22>,
wherein the oxide stacked film has no optical absorption band resulting from an electron transition in a visible light region or a near-infrared region.
<24> A semiconductor element including
the metal oxide film according to <20> or <21> or the oxide stacked film according to <22> or <23>.
<25> The semiconductor element according to <24>,
wherein the semiconductor element includes a diode.
<26> A field-effect transistor including:
a gate electrode, which is configured to apply gate voltage;
a source electrode and a drain electrode;
an active layer formed of a semiconductor film, which is formed between the source electrode and the drain electrode; and
a gate insulating layer formed between the gate electrode and the active layer,
wherein the gate insulating layer or the semiconductor film is the metal oxide film according to <20> or <21> or the oxide stacked film according to <22> or <23>.

The present disclosure solves the conventionally existing problems and it is possible to easily prepare a large area of the metal oxide film at a low process temperature and to prevent damage to an underlayer to form a stacked structure.

REFERENCE SIGNS LIST

1 Substrate
2 Gate electrode
3 Gate insulating layer
4 Source electrode
5 Drain electrode
6 Active layer
7 First interlayer dielectric
8 Second interlayer dielectric
9 Third interlayer dielectric

The invention claimed is:
1. A coating liquid for forming a metal oxide film, the coating liquid comprising:
a metal source, which is at least one selected from the group consisting of inorganic salts, oxides, hydroxides, metal complexes, and organic acid salts;
at least one alkali selected from the group consisting of organic alkalis and inorganic alkalis; and
a solvent,
wherein the metal source is dissolved in the solvent.
2. The coating liquid for forming a metal oxide film according to claim 1, wherein a pH of the coating liquid for forming a metal oxide film is 5 or more.
3. The coating liquid for forming a metal oxide film according to claim 1,
wherein the pH of the coating liquid for forming a metal oxide film is 6 or more but 12 or less.
4. The coating liquid for forming a metal oxide film according to claim 1,
wherein the pH of the coating liquid for forming a metal oxide film is 6.5 or more but 11 or less.
5. The coating liquid for forming a metal oxide film according to claim 1,
wherein the alkali includes at least one selected from the group consisting of quaternary ammonium salts and quaternary ammonium hydroxides.
6. The coating liquid for forming a metal oxide film according to claim 1,
wherein the alkali includes aminoalcohol.
7. The coating liquid for forming a metal oxide film according to claim 6,
wherein the aminoalcohol includes at least one selected from the group consisting of dialkanolamines and trialkanolamines.
8. The coating liquid for forming a metal oxide film according to claim 1,
wherein the inorganic salt includes at least one selected from the group consisting of nitrates, sulfates, chlorides, carbonates, acetates, and phosphates.
9. The coating liquid for forming a metal oxide film according to claim 1,
wherein the organic acid salt includes at least one selected from the group consisting of carboxylates, phenols, and derivatives thereof.
10. The coating liquid for forming a metal oxide film according to claim 1,
wherein the solvent includes at least one selected from the group consisting of organic acids, organic acid esters, aromatic compounds, diols, glycol ethers, polar aprotic solvents, alkane compounds, alkene compounds, ethers, alcohols, and water.
11. The coating liquid for forming a metal oxide film according to claim 1,
wherein the metal source includes at least one Group A element selected from the group consisting of rare earth elements, Bi, Te, and Sb.
12. The coating liquid for forming a metal oxide film according to claim 1,
wherein the metal source includes at least one Group B element selected from the group consisting of Mg, Ca, Sr, and Ba.
13. The coating liquid for forming a metal oxide film according to claim 1,
wherein the metal source includes at least one Group C element selected from the group consisting of Ti, Zr, Hf, Al, and Ga.
14. The coating liquid for forming a metal oxide film according to claim 1,
wherein the metal source includes at least one Group D element selected from the group consisting of Zn, Cd, Ga, In, Tl, Sn, and Pb.
15. The coating liquid for forming a metal oxide film according to claim 1,
wherein the metal source includes at least one Group E element selected from the group consisting of Ti, Zr, Hf, Sn, Nb, Ta, Mo, W, and Re.
16. The coating liquid for forming a metal oxide film according to claim 1,
wherein an electron configuration of a metal ion included in the metal source is a closed-shell.
17. The coating liquid for forming a metal oxide film according to claim 1,
wherein the coating liquid for forming a metal oxide film is transparent or light yellow.
18. A method for producing a metal oxide film, the method comprising:
coating the coating liquid for forming a metal oxide film according to claim 1 on an object to be coated and drying the coating liquid, followed by baking.
19. A method for producing a field-effect transistor including a gate electrode, a gate insulating layer, and an active layer with the coating liquid for forming a metal oxide film according to claim 1, the method comprising:
at least one of (1), (2), and (3) below:
(1) forming an oxide semiconductor film as the active layer, by coating the coating liquid for forming a metal oxide film as a coating liquid for forming an oxide semiconductor film on the gate insulating layer that is the oxide insulator film;

(2) forming an oxide insulator film as the gate insulating layer, by coating the coating liquid for forming a metal oxide film as a coating liquid for forming an oxide insulator film on the active layer that is the oxide semiconductor film; and (3) forming an oxide insulator film as an interlayer dielectric, by coating the coating liquid for forming a metal oxide film as a coating liquid for forming an oxide insulator film on the gate insulating layer and the gate electrode.

20. The coating liquid for forming a metal oxide film according to claim 1, wherein the solvent comprises water and/or the metal source is in a form of a hydrate.

* * * * *